United States Patent
Schmidt

(10) Patent No.: US 8,809,949 B2
(45) Date of Patent: *Aug. 19, 2014

(54) TRANSISTOR COMPONENT HAVING AN AMORPHOUS CHANNEL CONTROL LAYER

(75) Inventor: Gerhard Schmidt, Wernberg (AT)

(73) Assignee: Infineon Technologies Austria AG, Villach (AT)

( * ) Notice: Subject to any disclaimer, the term of this patent is extended or adjusted under 35 U.S.C. 154(b) by 651 days.

This patent is subject to a terminal disclaimer.

(21) Appl. No.: 12/486,461

(22) Filed: Jun. 17, 2009

(65) Prior Publication Data
US 2010/0320535 A1    Dec. 23, 2010

(51) Int. Cl.
    *H01L 29/66* (2006.01)
(52) U.S. Cl.
    USPC ........... 257/335; 257/339; 257/409; 257/492; 257/408; 257/26; 257/328; 257/336
(58) Field of Classification Search
    USPC ........... 257/339, 409, 26, 335–336, 492, 408, 257/328
    See application file for complete search history.

(56) References Cited

U.S. PATENT DOCUMENTS

| | | | | |
|---|---|---|---|---|
| 4,270,137 A | * | 5/1981 | Coe | 257/408 |
| 4,290,078 A | * | 9/1981 | Ronen | 257/409 |
| 4,800,415 A | * | 1/1989 | Simmons et al. | 257/26 |
| 5,216,275 A | | 6/1993 | Chen | |
| 6,410,958 B1 | | 6/2002 | Usui et al. | |
| 6,455,892 B1 | * | 9/2002 | Okuno et al. | 257/328 |
| 6,462,377 B2 | | 10/2002 | Hurkx et al. | |
| 2005/0269660 A1 | * | 12/2005 | Singh | 257/492 |
| 2005/0280114 A1 | * | 12/2005 | Singh | 257/502 |
| 2007/0138542 A1 | * | 6/2007 | Schmidt | 257/328 |
| 2009/0008723 A1 | * | 1/2009 | Schmidt | 257/409 |
| 2009/0267078 A1 | * | 10/2009 | Mishra et al. | 257/76 |
| 2010/0320536 A1 | * | 12/2010 | Schmidt | 257/337 |

FOREIGN PATENT DOCUMENTS

| | | |
|---|---|---|
| DE | 19840032 C1 | 11/1999 |
| DE | 19848828 A1 | 5/2000 |
| DE | 19958151 A1 | 6/2001 |
| DE | 10132136 C1 | 2/2003 |
| DE | 102 45 049 | 4/2004 |
| DE | 10358985 B3 | 5/2005 |
| DE | 102004005775 A1 | 8/2005 |
| DE | 102007030755 B3 | 2/2009 |
| EP | 0400178 A1 | 12/1990 |
| WO | 0038242 A1 | 6/2000 |

OTHER PUBLICATIONS

V. Litovchenko et al., "Field Electron Emission from Silicon Tip Arrays Coated with Nitrogen Doped DLC Films", Proc. 10th IVMC 1997, pp. 390-395.

N. Dmitruk et al., "Determination of Energy Barrier Heights at Si-DLC Interface in Field Emission Structures", Proc. 14th IVMC 2001, pp. 293-294.

(Continued)

*Primary Examiner* — Fernando L Toledo
*Assistant Examiner* — Mohammed Shamsuzzaman
(74) *Attorney, Agent, or Firm* — Dicke, Billig & Czaja, PLLC

(57) ABSTRACT

Disclosed is a semiconductor component, including: a drift zone arranged between a first and a second connection zone; a channel control layer of an amorphous semi-insulating material arranged adjacent to the drift zone.

7 Claims, 22 Drawing Sheets

(56) References Cited

OTHER PUBLICATIONS

N. Mott et al., "Electronic Processes in Non-Crystalline Materials", Clarendon-Press Oxford, 1979.
S. Sze, "Semiconductor Devices: Physics and Technology", 2nd Edition, 1985, 2002 by John Wiley & Sons, Inc.
J. Kanicki, "Properties of Metal/Hydrogenated Amorphous Silicon Interfaces", Chapter 5, IBM Research Division, NY, pp. 189-282.
G. Cherkashinin et al., "Mobility edge in hydrogenated amorphous carbon", Applied Physics Letters 88, 172114 (2006).
J. Robertson, "Diamond-like amorphous carbon", Materials Science and Engineering R 37 (2002) pp. 129-281.
M. Allon-Alaluf et al., "Metal contacts and electrical processes in amorphous diamond-like carbon films", Diamond and Related Materials, 5 (1996) pp. 1275-1281.
"Properties of Amorphous Carbon", 2003 The Institution of Electrical Engineers, ISBN 0 85296 961 9.
A. Porst et al., Improvement of the Diode Characteristics Using Emitter-Controlled Principles (EMCON-Diode), pp. 213-216.
Landolt-Boernstein, "Zahlenwerte und Funktionen aus Naturwissenschaften und Technik", Gruppe III, Band 23, pp. 12-14.
Landolt-Boernstein, "Zahlenwerte und Funktionen aus Physik, Chemie, Austronomie, Geophysik, und Technik", Band 1, 1955, p. 761.
D. Dasgupta et al., "Electrical conductivity of amorphous carbon and amorphous hydrogenated carbon", Philosophical Magazine B, 1991, vol. 63, No. 6, pp. 1255-1266.
V. Litovchenko et al., "Field Electron Emission from Silicon Tip Arrays Coated with Nitrogen Doped DLC Films", Proc. 10th IVMC, Aug. 17-21, 1997, pp. 390-395.
N. Dmitruk et al., "Determination of Energy Barrier Heights at Si-DLC Interface in Field Emission Structures", Proc. 14th IVMC, Aug. 12-16, 2001, pp. 293-294.
N. Mott et al., "Electronic Processes in Non-Crystalline Materials", Clarendon-Press Oxford, Aug. 30, 1979.
S. Sze, Semiconductor Devices: Physics and Technology, 2nd Edition, Jan. 2002 by John Wiley & Sons, Inc.
J. Kanicki, "Properties of Metal/Hydrogenated Amorphous Silicon Interfaces", Chapter 5, IBM Research Division, NY, pp. 189-282, Apr. 27-May 1, 1992.
G. Cherkashinin et al., "Mobility Edge in Hydrogenated Amorphous Carbon", Applied Physics Letters 88, 172114 Apr. 2006.
J. Robertson, "Diamond-like Amorphous Carbon", Materials Science and Engineering R 37, May 24, 2002 pp. 129-281.
M. Allon-Alaluf et al., "Metal Contacts and Electrical Processes in Amorphous Diamond-like Carbon Films", Diamond and Related Materials, 5, Nov. 1996 pp. 1275-1281.
"Properties of Amorphous Carbon", Jan. 1, 2003, The Institution of Electrical Engineers, ISBN 0 85296 961 9.
A. Porst et al., Improvement of the Diode Characteristics Using Emitter-Controlled Principles (EMCON-Diode), pp. 213-216, May 1997.
Landolt-Boernstein, "Zahlenwerte und Funktionen aus Naturwissenschaften und Technik", Gruppe III, Band 23, pp. 12-14, Jan. 1989.
Landolt-Boernstein, "Zahlenwerte und Funktionen aus Physik, Chemie, Austronomie, Geophysik, und Technik", Band 1, Jan. 1955, p. 761.
D. Dasgupta et al., "Electrical conductivity of amorphous carbon and amorphous hydrogenated carbon", Philosophical Magazine B, Sep. 27, 1990, vol. 63, No. 6, pp. 1255-1266.
A. Evtukh et al., "Silicon Doped Diamond-Like Carbon Films as a Coating for Improvement of Electron Field Emission", Proceedings of the 14th International Vacuum Microelectronics Conference, Aug. 12-16, 2001, pp. 295-296.
D. Dasgupta et al., "bands and gap states from optical absorption and electron-spin-resonance studies on amorphous carbon and amorphous hydrogenated carbon films", Physical Review B, vol. 43, No. 3, Jan. 15, 1991, pp. 2131-2135.
K. Chew et al., "Gap state distribution in amorphous hydrogenated silicon carbide films deduced from photothermal deflection spectroscopy", Journal of Applied Physics, vol. 91, No. 7, Apr. 1, 2002, pp. 4319-4325.
S. Buettgenbach, "Chemical Microsensors and Applications", Proceedings of SPIE, Nov. 4-5, 1998, pp. 139-146.
G. Adamopoulos et al., "Hydrogen content estimation of hydrogenated amorphous carbon by visible Raman spectroscopy", Journal of Applied Physics, vol. 96, No. 11, Dec. 1, 2004, pp. 6348-6352.
M. Pollak, "Approximations for the ac Impurity Hopping Conduction", Physical Review, vol. 133, No. 2A, Jan. 20, 1964, pp. A564-A579.
J. Tihanyi, "A Qualitative Study of the DC Performance of SIPMOS Transistors", Siemens AG, May 12, 1980, pp. 181-189.

* cited by examiner

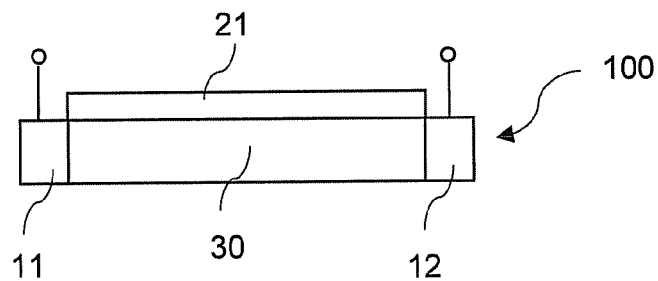
FIG 1
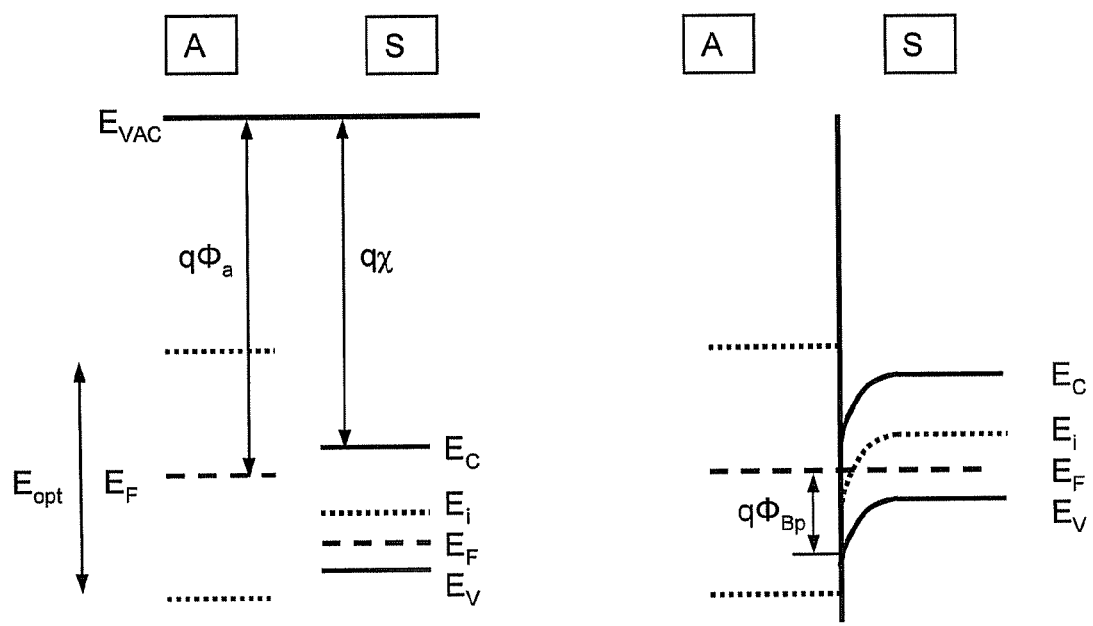
FIG 2A                    FIG 2B

TRANSISTOR COMPONENT HAVING AN AMORPHOUS CHANNEL CONTROL LAYER

TECHNICAL FIELD

One embodiment relates to a semiconductor component having a drift zone.

BACKGROUND

Power semiconductor components, such as power MOSFET, power IGBT or power diodes, include a—usually low doped—drift zone that is arranged between two connection zones, and in which a space charge zone propagates when the component blocks. The characteristics of this drift zone significantly determine the on-resistance of the component, and also its blocking voltage capability. One aspect in the development of power semi-conductor components is to reduce the specific on-resistance $R_{DSon} \cdot A$, i.e. with a given chip area to produce components that are as high-blocking as possible, but that nevertheless have a low on-resistance.

One possibility to reduce the on-resistance of a power semiconductor component having a given blocking voltage capability is to apply the compensation principle. Here, compensation zones that are doped complementarily to the drift zone are provided in the drift zone.

A further possibility for reducing the on-resistance of a semiconductor component is providing a field electrode that is dielectrically insulated from the drift zone.

Further, a lateral power MOSFET is known having several auxiliary electrodes arranged in the drift zone of the component and being insulated from the drift zone by a dielectric. These auxiliary electrodes are made of a semi-insulating polysilicon (SIPOS), or of a resistor material and are arranged between a source and a drain terminal of the component. The auxiliary electrodes effect the development of a depletion layer in the drift zone when the component is driven in its blocking state.

According to a newer concept for reducing the on-resistance of a power semiconductor component a so-called drift control zone is provided, the drift control zone being made of a semiconductor material, extending in a current flow direction along the drift zone, and being dielectrically insulated from the drift zone. In this connection the drift control zone is electrically connected such that with a conducting component it controls an accumulation or an inversion channel in the drift zone, and that with a blocking component a space charge zone propagates in the drift zone as well as in the drift control zone.

For these and other reasons there is a need for the present invention.

SUMMARY

One embodiment of the present disclosure relates to a semiconductor component, including: a drift zone being arranged between a first and a second connection zone; a channel control layer of an amorphous semi-insulating material being arranged adjacent to the drift zone.

BRIEF DESCRIPTION OF THE DRAWINGS

In the following examples will be explained with reference to drawings. These drawings serve to explain the basic principle, so that only features necessary for understanding the basic principle are illustrated in the drawings. Unless stated otherwise, same reference characters denote same features with the meaning throughout the drawings.

FIG. 1 illustrates by means of a cross-section through a semiconductor body a component having a drift zone, and a channel control layer of an amorphous semi-insulating material arranged adjacent to the drift zone.

FIG. 2 illustrates by means of a band diagram the operating principle of an amorphous semi-insulating channel control layer on a semiconductor material of a first conduction type.

DETAILED DESCRIPTION OF THE DRAWINGS

Figure 3A:
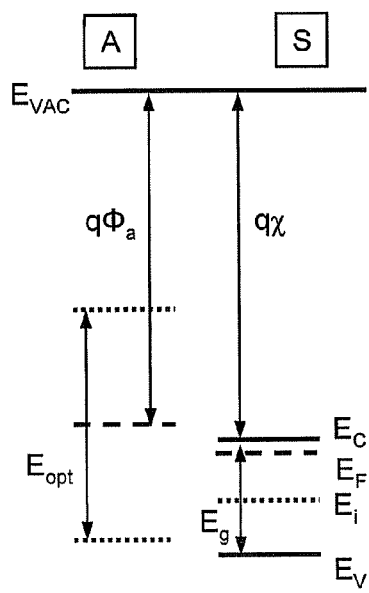
FIG. 3 illustrates by means of a band diagram the operating principle of an amorphous semi-insulating channel control layer on a semiconductor material of a second conduction type.
Figure 3B:
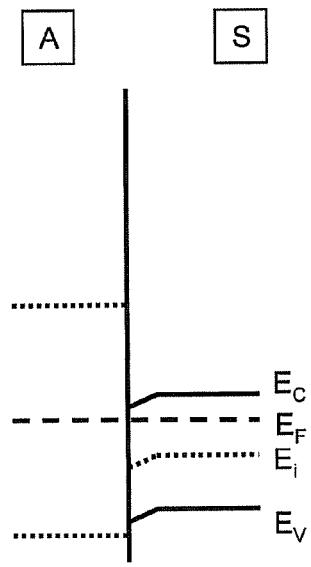
Figure 4:
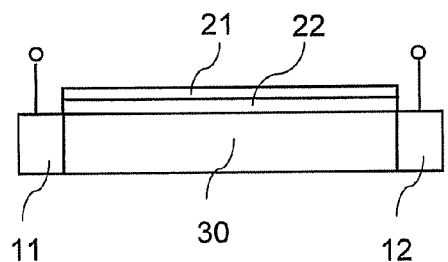
FIG. 4 illustrates by means of a cross-section through a semiconductor body a semiconductor component having a drift zone, and a channel control layer of an amorphous semi-insulating material adjacent to the drift zone, with a dielectric layer arranged between the channel control layer and the drift zone.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The present disclosure relates to a concept of reducing the electrical resistance of a drift zone of a semiconductor component, in one embodiment of a power semiconductor component. This concept may be applied to a plurality of different components that will be explained in detail in the following. With reference to FIGS. 1 to 6 the basic principle will be explained first.

Referring to FIG. 1, for explaining this basic concept a semiconductor component is examined, the semiconductor component having a first and a second connection zone 11, 12, and a drift zone arranged between the first and the second connection zones 11, 12. Connections zones 11, 12 are contacted by connection contacts (schematically illustrated) via which an electrical voltage can be applied between the connection zones 11, 12. Drift zone is made of a semiconductor material, in one embodiment a monocrystalline semiconductor material.

The component includes adjacent to the drift zone 30 a channel control layer of an amorphous semi-insulating material, which in the example illustrated directly contacts the drift zone 30. The work function of the amorphous material used for the channel control zone 21 is adapted to the doping type and the doping concentration of the drift zone 30 such that an inversion channel or an accumulation channel develops in the drift zone 30 along the interface between the drift zone 30 and the channel control zone 21.

Semi-insulating amorphous materials are generally known. Examples of such materials are amorphous silicon (aSi) that may be undoped or that may be doped with hydrogen (aSi:H), amorphous silicon carbide ($aSi_{1-x}C_x$) that may be undoped or that may be doped with hydrogen (($aSi_{1-x}C_x$:H), diamond like carbon (DLC) that may be undoped or that may be doped with hydrogen, silicon or nitrogen, or semi-insulating polysilicon SIPOS). Further examples of amorphous semi-insulating layers are metal doped carbon layers, that may additionally include hydrogen. Further suitable dopants for amorphous semi-insulating layers are, e.g., fluorine (F), oxygen (O), boron (B), etc.

Layers of such semi-insulating amorphous materials may be produced, e.g., by vapor deposition or by chemical vapor deposition (CVD). Pure DLC layers, silicon doped DLC layers or amorphous SiC layers may, e.g., be produced by a plasma supported CVD from precursor gases, such as silane or methane. A silicon doped DLC layer, like an amorphous $Si_{1-x}C_x$ layer, includes carbon and silicon as chemical elements, a DLC layer being characterized by a diamond-like basic structure that may be obtained by suitably selecting the deposition conditions.

By the gas flows of the precursors in a DLC layer the silicon doping or in an amorphous $Si_{1-x}C_x$-layer the mixing ratio x of silicon (Si) and carbon (C) can be set.

In order to obtain a good electrical connection of the channel control layer 21 to the drift zone 30 the contact surface, which is the surface of the drift zone 30 on which the amorphous layer is arranged, may be cleaned beforehand. For this a plasma etching, using, e.g., fluorine ions, or sputtering the surface with inert gas ions is suitable, e.g.

As is well known the work function of an amorphous semi-insulating layer may be set by the choice of the deposition conditions during the production, such as work pressure, HF power during the deposition, amount of gas flow, composition, and the plasma potential (self-bias) resulting from the chamber geometry, and by its doping. As it will be explained in the following, the work function determines the suitability of the channel control layer 21 to effect an inversion or accumulation channel in the drift zone 30 along the channel control layer 21.

First the case is examined that an inversion channel should develop either in a p-doped or in an n-doped drift zone 30 induced by the channel control layer 32. In a p-doped drift zone 30 the inversion channel is an electron channel (n-channel), and in an n-doped drift zone 30 the inversion channel is a hole channel (p-channel). For developing an inversion channel in a p-doped drift zone 30 a surface potential or contact potential, respectively, has to be present which is at least:

$$\psi_s(inv) = \frac{2kT}{q}\ln\left(\frac{N_A}{n_i}\right) \tag{1a}$$

(see: Sze: "Semiconductor Devices", 2nd edition, John Wiley and Sons, 2002, page 175).

Here, k denotes the Boltzmann constant, T the absolute temperature, q the elementary charge, $N_A$ the acceptor concentration (p-doping), and $n_i$ the intrinsic concentration. Equivalently in an n-doped drift zone a surface potential has to be present for developing an inversion channel, which is at least:

$$\psi_s(inv) = \frac{2kT}{q}\ln\left(\frac{N_D}{n_i}\right) \tag{1b}$$

Here, $N_D$ denotes the donator concentration in the drift zone.

The so-called barrier height $q\Phi_{Bp}$ of a p-doped semiconductor material is the sum of the contact potential and the difference $E_F - E_V$ between the Fermi level $E_F$ and the energy level $E_V$ of the valence band. It therefore applies:

$$q\Phi_{Bp} = q\psi_s + E_F - E_V \tag{2a}$$

Equivalently, in an n-doped semiconductor material the barrier height $q\Phi_{Bp}$ is the sum of the contact potential $q\Psi_s$ and the difference $E_C$–$E_F$ between the energy level $E_C$ of the conduction band and the Fermi level $E_F$. It therefore applies:

$$q\Phi_{Bn} = q\psi_s + E_C - E_F \qquad (2b)$$

In equations (2a) and (2b) $\Psi_S$ generally denotes the surface potential. These equations apply independent of any surface potentials. The barrier height for the setting-in of strong inversion is obtained, if $\Psi_S$ in equations (2a) and (2b) is according to equations (1a) and (1b) set to be equal to the surface potential $\Psi_S(\text{inv})$.

The difference $E_F$–$E_V$ between the Fermi level and the energy level of the valence band, or the valence band edge, respectively, in a p-doped semiconductor material, and a difference $E_C$–$E_F$ between the energy level of the conduction band and the Fermi level in an n-doped semiconductor material is in each case dependent on the acceptor concentration $N_A$ and the donator concentration $N_D$, respectively. It applies for these differences:

$$E_F - E_V = kT\ln\left(\frac{N_C}{N_D}\right) \qquad (3a)$$

$$E_C - E_F = kT\ln\left(\frac{N_V}{N_A}\right) \qquad (3b)$$

(see Sze, l.c., page 39). Here, $N_C$ denotes the effective (equivalent) state density in the conduction band, and $N_V$ denotes the effective (equivalent) state density in the valence band. These state densities are material constants and are, independent of the type of the semiconductor material. For example, for silicon: $N_V = 2.66 \cdot 10^{19}$ cm$^{-3}$ and $N_C = 2.86 \cdot 10^{19}$ cm$^{-3}$ (see Sze, l.c., page 538).

By high frequency measurements of the junction capacity of a system having an amorphous semi-insulating layer and a crystalline semiconductor layer it can be shown that the amorphous-crystalline heterojunction between the amorphous semi-insulating layer and the adjoining semiconductor material acts like a Schottky junction. For the barrier height of such Schottky junction to a p-doped semiconductor material:

$$q\Phi_{Bp} = E_g - q(\Phi_m - \chi) \qquad (4a)$$

Equivalently, for the barrier height of such Schottky junction to an n-doped semiconductor material:

$$q\Phi_{Bn} = q(\Phi_m - \chi) \qquad (4b)$$

(see Sze., l.c., page 226). In this connection $E_g$ denotes the band gap of the used semiconductor material, $\chi$ the electron affinity, and $q\Phi_m$ the work function of the used Schottky metal. The band gap $E_g$ and the electron affinity $\chi$ are material constants. For example, for silicon as a semiconductor material: $E_g = 1.12$ eV and $q\chi = 4.05$ eV, for gallium arsenide (GaAs): $E_g = 1.42$ eV and $q\chi = 4.07$ eV, and for silicon carbide (SiC) of the 6H polytype: $E_g = 3.05$ eV and $q\chi = 3.77$ eV.

Applying equations (4a) and (4b) to an amorphous heterojunction at which an amorphous material having a work function $q\Phi_a$ contacts the drift zone 30 instead of a Schottky metal, the barrier height is in an equivalent manner:

$$q\Phi_{Bp} = E_g - q(\Phi_a - \chi) \qquad (5a)$$

$$q\Phi_{Bn} = q(\Phi_a - \chi) \qquad (5b)$$

Using equations (2a) and (2b), which in connection with equations (1a) and (1b) define the required barrier height for setting-in of the inversion, and using equations (5a) and (5b) for that work function $q\Phi_a$ of the amorphous semi-insulating channel control layer that is required that an inversion layer develops it is obtained as a condition:

$$q\Phi_a \leq E_g + q\chi - q\psi_s(\text{inv}) - (E_F - E_V) \qquad (6a)$$

$$q\Phi_a \geq q\chi - q\psi_s(\text{inv}) + (E_C - E_F) \qquad (6b).$$

Equation (6a) is valid for a p-doped drift zone, i.e. defines the required work function of the amorphous material of the channel control layer 21 for development of an n-channel in a p-doped drift zone, and equation (6b) is valid for an n-doped drift zone 31, i.e., it defines the required work function of the amorphous material of the channel control layer 21 for the development of a p-channel in an n-doped drift zone.

According to a further example, induced by the amorphous semi-insulating channel control layer 21 an accumulation channel develops in the drift zone 30. This accumulation channel is an electron channel (n-channel) with an n-doped drift zone 30, and a hole channel (p-channel) with a p-doped drift zone 30. In order to develop such accumulation channel the work function $q\Phi_a$ is for an n-doped drift zone:

$$q\Phi_a < q\chi + (E_C - E_F) \qquad (7a),$$

and for a p-doped drift zone:

$$q\Phi_a > E_g + q\chi - (E_F - E_V) \qquad (7b).$$

The surface potentials and energy differences given in equations (6a) and (6b), and the energy differences given in equations (7a) and (7b) are referring to equations (1a) and (1b) as well as (3a) and (3b) temperature dependent. In this connection the work function $q\Phi_a$ is selected such that the conditions according to equations (6a), (6b), (7a) or (7b) are met at least for that temperature range for which the component is specified. This temperature range is, e.g., between 225K and 425K.

As an example p-doped silicon as the material of the drift zone and having an acceptor concentration $N_A$ of $1 \cdot 10^{17}$ cm$^{-3}$ is examined. The following values are valid for room temperature (about 300K). In this case, the contact potential required for an inversion according to equation (1a) is $\psi_s(\text{inv}) = 0.82$V. The difference between the conduction band and the valence band in this case is $E_F - E_V = 0.12$ eV, so that according to equation (2a) a barrier height of 0.94 eV results that at least has to be reached. For a higher doping concentration $N_A$ of about $10^{18}$ cm$^{-3}$ a higher contact potential $\psi_s = 0.93$V for the onset of a strong inversion is required. However, the difference $E_F - E_V$ reduces to about 0.07 eV, so that an overall barrier height of about 1.0 eV results.

The barrier height that according to equation (5a) has to be set by the work function therefore has to be at least 0.94 eV for the first example, and at least 1.0 eV for the second example. This is obtained, if the work function $q\Phi_a \leq 4.23$ eV and $q\Phi_a \leq 4.17$ eV, respectively. A layer suitable as amorphous semi-insulating channel control layer 21 is, e.g., an amorphous DLC layer deposited by HF deposition at a frequency of about 13.56 MHz in a capacitively coupled parallel plate reactor. As a first precursor gas for the carbon of the DLC layer methane or another gaseous hydrocarbon is used. A silicon doping of the DLC layer is achieved by adding silane as a second precursor gas. The characteristics of the DLC layer, in one embodiment its work function, are determined by the HF power, the work pressure in the process chamber, the gas flows of the precursors, and the chamber geometry. The latter determines the so-called self-bias that develops in the plasma and that effects an acceleration of the positively charged ion cores to the semiconductor layer on which the amorphous layer is to be deposited.

A DLC layer having a work function of, e.g., 4.17 eV, i.e. having a barrier height of 1.0 eV, on a p-doped layer may, e.g., be deposited at a work pressure of about 100 mT in the process chamber, a gas flow ratio between the first and the second precursor gas of about 3, and a HF power of about 200 W.

It should be mentioned that using a DLC layer as amorphous semi-insulating layer is only an example, and that any other amorphous semi-insulating layers may be used in which by a suitable selection of the deposition conditions the work function is set such that—dependent on the doping of the drift zone 30—one of the conditions (6a), (6b), (7a) or (7b) is met.

Empirically one can say that an inversion channel develops when the barrier height set by the work function $q\Phi_a$ according to equation (3b) is at least 65%, and is in one embodiment at least 70%, of the band gap $E_g$ of the used semiconductor material. This is valid for any semiconductor material, and is valid for development of an inversion channel in a p-doped drift zone 30 (as explained before), as well for the development of an inversion channel in a n-doped drift zone. The barrier height of 0.94 eV and 1.0 eV for a p-doped silicon mentioned before are, e.g., 84% and 89% of the band gap of 1.12 eV.

The conditions for the development of an inversion layer in a p-doped drift zone 30 controlled by the channel control zone will be explained in the following using band diagram illustrated in FIGS. 2A and 2B. FIG. 2A shows left-hand the band diagram of the amorphous channel control layer "A", and right-hand of the semiconductor material "S". Here, $E_{VAC}$ denotes the energy level of the vacuum, $E_{opt}$ denotes the so-called optical band gap of the amorphous material, and $E_i$ denotes the intrinsic level of the semiconductor. FIG. 2B shows the band diagram of the amorphous-crystalline heterojunction.

Due to the different Fermi levels of the amorphous material and the semiconductor material there is a band bending in the semiconductor material. The amplitude of this band bending corresponds to the contact potential $\psi_s$, where a strong inversion sets in, when—as illustrated—the band bending at the semiconductor surface is twice the difference between the Fermi level $E_F$ and the intrinsic level $E_i$. The barrier height $q\Phi_{Bp}$ corresponds to the contact potential, or the band bending plus the difference $E_F$–$E_V$ between the Fermi level and the energy level of the valence band edge, respectively.

The band diagram illustrated before is valid for any semiconductor materials, such as gallium arsenide (GaAs) having a band gap $E_g$=1.42 eV and an electron affinity $q\chi$=4.07 eV, or silicon carbide (SiC), in one embodiment 6H—SiC having a band gap $E_g$=3.0 eV, and an electron affinity $q\chi$=3.77 eV. It can be shown that an amorphous semi-insulating material having a work function $q\Phi_a$ of 4.23 eV, or less, is also suitable for development of an inversion channel in a p-doped layer of such a semiconductor material, where in these materials due to the higher band gap there is a stronger band bending compared to silicon.

Hereinbefore the work function to be adjusted by the deposition conditions and/or by the doping and being required for development of an inversion channel (see equations (6a) and (6b)) in the drift zone was derived. The work function required for a strong inversion was derived. In this connection it should be mentioned that also amorphous semi-insulating channel control layer 21 having work functions that do not meet the conditions given in equations (6a) and (6b) may already contribute to a reduction of the switching losses, even if there is only a weak inversion in this case.

FIG. 3A shows the band diagram of an amorphous-crystalline heterojunction between an amorphous material and a n-doped drift zone. The amorphous material is selected such that it would be suitable for development of an inversion channel in a p-doped drift zone 30, i.e. the barrier height $q\Phi_{Bp}$ therefore is at least 70% of the band gap $E_g$. Because of $E_g$=$q\Phi_{Bp}$+$q\Phi_{Bn}$ (see Sze, 1.c., page 227) the barrier height of a n-doped material is in this case 30% of the band gap $E_g$, or less. Referring to FIG. 3A, this low band gap causes a so-called flat band condition or at a lower n-doping the development of an accumulation channel in the drift zone 30.

Figure 5:
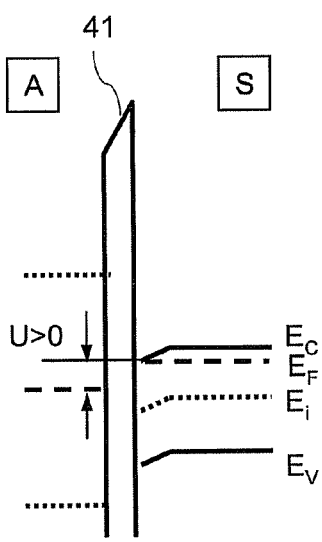
FIG. 5 illustrates the band diagram of a component according to FIG. 4.

The development of a continuous accumulation channel, or a continuous accumulation edge layer, respectively, may be supported by inserting an insulating layer 22 between the drift zone 30 and the channel control layer 21, if through this the potential difference in the vertical direction can be increased in the switched-on state of the component. Since the insulating intermediate layer 22, which is a dielectric layer, e.g., prevents a current flow across the amorphous-crystalline heterojunction, dependent on a contacting of the channel control layer 21 either a constant potential or a lateral linear potential curve across the semi-insulating channel control layer 21 settles in. Since this case is always close to the flat band condition the population of the edge layer may be reduced rapidly, in one embodiment when the potential curves at the semiconductor surface and in the channel control layer without an additional barrier would equalize in thee switched-on state. The band diagram of an amorphous-crystalline heterojunction having such insulation layer or dielectric layer 22, respectively, is illustrated in FIG. 5.

At a junction at which the amorphous channel control layer 21 and the doping of the drift zone 30 are adapted to one another such that an inversion channel develops, providing a dielectric layer between the channel control layer 21 and the drift zone 30 is not mandatory, because the high band bending already provides for a sufficient population of the channel region. Nevertheless, such dielectric layer may be provided for; however, it weakens the development of the inversion channel, because a part of the contact potential or reference potential, respectively, drops across the dielectric layer 22.

Figure 6:
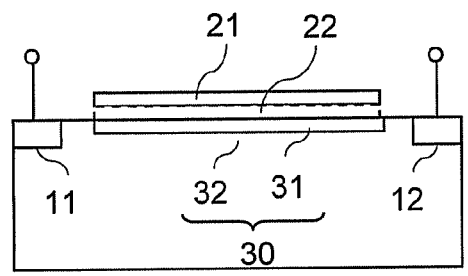
FIG. 6 illustrates by means of a cross-section through a semiconductor body a component having a drift zone with two complementarily doped drift zone sections.

Referring to FIG. 6 drift zone 30 may include two differently doped drift zone sections: A first drift zone section 31 having a doping type and a doping concentration adapted to the work function of the amorphous channel control layer 21 such that an inversion channel develops along the interface between the channel control layer 21 and the first drift zone section 31; a second drift zone section 32 being doped complementarily to the first drift zone section 31, and being at least partly separated from the channel control layer 21 by the first drift zone section 31. The first drift zone section 31 is also be referred to as inversion section of the drift zone 30. Optionally a dielectric layer 22 is arranged between the channel control layer 21 and the drift zone 30. When this dielectric layer 22 is present dielectric layer 22 contacts the first drift zone section 31; in this case channel control layer 21 (in a manner not illustrated) at least at a lateral end is on a defined electrical potential. This potential may be the potential of the drift zone 30 or of one of the connection zones 11, 12.

The dimensions of the first drift zone section 31 may be adapted to the dimensions of the channel control layer 21 and the dielectric layer 22, respectively, such that the channel control layer 21, and the dielectric layer 22, respectively exclusively contacts the inversion section 31 of the drift zone 30. However, the dimensions of the inversion section 31 may also be smaller than the dimensions of the channel control layer 21 and the dielectric 22, respectively. In this case the channel control layer 21 and the dielectric layer 22, respectively, also contacts the second drift zone section 22 in sections.

The concept explained before for controlling an inversion channel or an accumulation channel in a drift zone 30 of a semiconductor component can be applied to any semiconductor components having a drift zone. Examples of such semiconductor components will be explained in the following.

Figure 7:
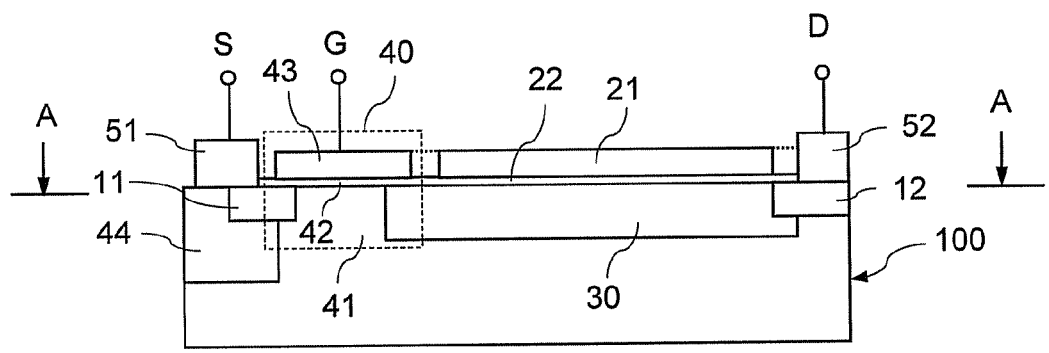
FIG. 7 illustrates by means of a cross-section through a semiconductor body a first embodiment of a lateral transistor component having a planar control structure.

FIG. 7 is a cross-section through a semiconductor body 100 illustrating an embodiment of a semiconductor component implemented as a MOSFET, in one embodiment a power MOSFET. In this component the first and second connection zones 11, 12 form source and drain zones that are arranged distant to one another. Between the drift zone 30 and the source zone 11 the component includes a control structure 40 having a body zone 41, a gate electrode 43 dielectrically insulated from the body zone 41 by a gate dielectric, and serving for controlling a conducting channel in the body zone 41 between the source zone 11 and the drift zone 30. In a normally-off MOS transistor body zone 41 is doped complementarily to the source zone 11. In this case gate electrode 43 serves for controlling an inversion channel along the gate dielectric 42 between the source zone 11 and the drain zone 30. In a normally-on MOS transistor body zone 41 is also doped complementarily to the source zone 11, but includes a complementarily doped semiconductor zone (not shown) along the gate dielectric 42. In this case gate electrode 43 serves for interrupting this channel when the component is driven to be blocking The conductivity type of the component is determined by the doping type of the source zone 11. In an n-conducting component source zone 11 is n-doped, and in a p-conducting component is p-doped. Body zone 41 is p-doped in a n-conducting component, and is n-doped in a p-conducting component. In an n-conducting component majority charge carriers are electrons, and in a p-conducting component are holes. The doping type of the drift zone 30 and the channel control layer 21 are adapted to one another such that a majority charge carrier flow is possible in the drift zone 30 when the component is conducting. This may be achieved due to the fact that drift zone 30 is of the same conduction type as the source zone, and that the work function of the amorphous channel control layer 21 is adjusted such that an accumulation channel develops in the drift zone 30. For this, drift zone 30 is n-doped in an n-conducting component, and drift zone 30 is p-doped in a p-conducting component. Alternatively, a majority charge carrier flow may be achieved in the drift zone 30 due to the fact that the drift zone 30 is doped complementarily to the source zone 11, and that the work function of the channel control layer 21 is set such that an inversion channel develops in the drift zone 30. In the latter case the channel control layer 21 is, in one embodiment, implemented such that it reaches from the drain zone 12 to the gate electrode 42 in a current flow direction, in order to definitely achieve development of an inversion channel along the complete length of the drift zone 30 when the component is conducting. In this connection the "current flow direction" is the direction in which charge carriers propagate in the drift zone of the component. In the component illustrated in FIG. 7, in which the source zone 11 and the drain zone 12 are arranged distant to one another in a lateral direction of the semiconductor body 100, this is a lateral direction of the semiconductor body 100.

Referring to FIG. 7, optionally a dielectric layer 22 may be provided between the channel control layer 21 and the drift zone 30. Dielectric layer 22 may, in one embodiment, be omitted when the doping of the drift zone 30 and the work function of the channel control layer 21 are adapted to one another such that an inversion channel develops in the drift zone 30.

It should be mentioned that the explanations made before with reference to FIGS. 1 to 6 regarding development of inversion or accumulation channels in the drift zone do accordingly apply to the component according to FIG. 7 and to all other components that will be explained in the following.

In FIG. 7 reference characters 51 and 52 denote connection electrodes of the source zone 11 and the drain zone 12. Source zone 11 and body zone 41 may be short-circuited—which is generally known for MOS transistors. For this a higher doped connection zone 44 of the same conductivity type as the body zone 41 is provided in the embodiment illustrated, the higher doped connection zone adjoining the body zone 41 and being contacted by the connection electrode 51.

Figure 8:
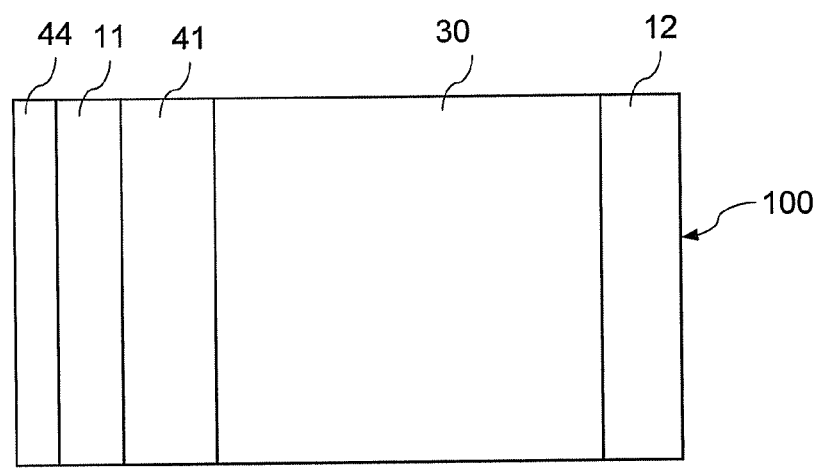
FIG. 8 illustrates by means of a horizontal cross-section through the semiconductor body an embodiment of a component according to FIG. 7.

Referring to FIG. 8 that shows a cross section through the component according to FIG. 7 in a section plane A-A, the component zones explained before may be implemented as elongated component zones in a direction perpendicular to the current flow direction. The current capability of the component increases with increasing dimension of these component zones in the direction perpendicular to the current flow direction. In a manner not illustrated in detail these component zones may also be arranged circular around the drain zone.

In a MOSFET the drain zone 12 is of the same conduction type as source zone 11. In the component according to FIG. 6—as well as in all other transistors explained in the following—channel control layer 21 may extend from the gate electrode 43 to the drain electrode 52, however, it may also be arranged distant to these electrodes. The channel control layer 21 is, in one embodiment, connected to one of the following terminals, or electrodes, respectively: gate, source or drain, or in a diode at least to the cathode or the anode, respectively.

Figure 9:
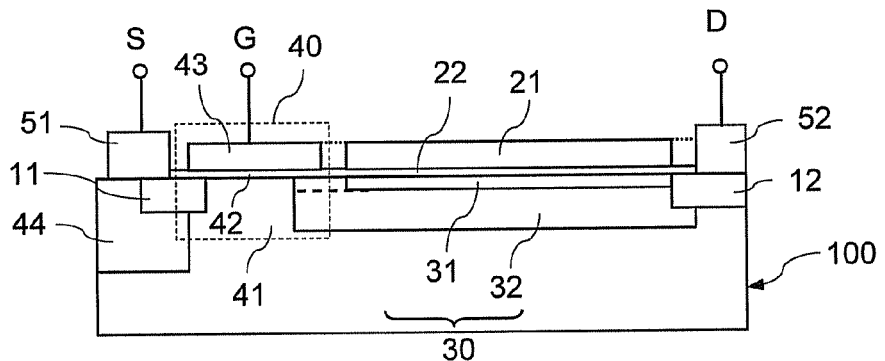
FIGS. 9 to 12 illustrate further embodiments of lateral transistor components having a planar control structure.

FIG. 9 is a cross-section through the semiconductor body 100 illustrating a component that is different from the one illustrated in FIG. 7 in that drift zone 30—in correspondence with the explanations given to FIG. 6—includes a first and a second drift zone section 31, 32. The first drift zone section, or inversion section 31, respectively, is doped complementarily to the source zone 11, i.e., in a n-conducting component it is p-doped, and in a p-conducting component it is n-doped. The second drift zone section 32 is of the same conduction type as source zone 11. The dimensions of the channel control layer 21 in the current flow direction correspond, in one embodiment, to the dimensions of the first drift zone section 31 in the current flow direction, so that an inversion channel may develop in the first drift zone section 31 along the complete length of the first drift zone section 31. In this component the channel control layer 21 may, in one embodiment, extend to the gate electrode 43 (shown in dashed lines), where in this case the first drift zone section 31 may extend to the body zone 41. The first drift zone section 31 and the body zone 41 may have equal doping concentrations. At a drain-sided end of the drift zone 30 the drain zone 12 may adjoin the first drift zone section 31 (as illustrated). Optionally, the first drift zone section 31 may be arranged distant to the drain zone 12.

Referring to FIG. 9, a dielectric layer 22 may be arranged between the channel control layer 21 and the drift zone 30. However, referring to FIG. 10, this dielectric layer 22 may also be omitted. Omission of this dielectric layer 22 improves the development of the inversion channel in the first drift zone section 21, as explained.

Figure 10:
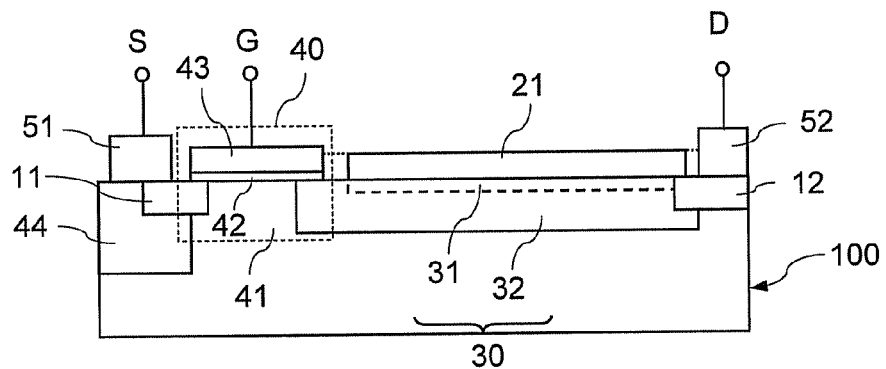

Referring to FIGS. 7, 9 and 10, the semiconductor body 100 in the region in which the component zones are realized may include a basic doping that corresponds to the doping of the body zone 41. The remaining component zones, i.e., source zone 11, drain 12 and drift zone 30, where the drift zone 30 that may include the first and second drift zone sections 31, 32, as well as the connection zone 44 may be produced by implantation and/or diffusion methods.

Figure 11:
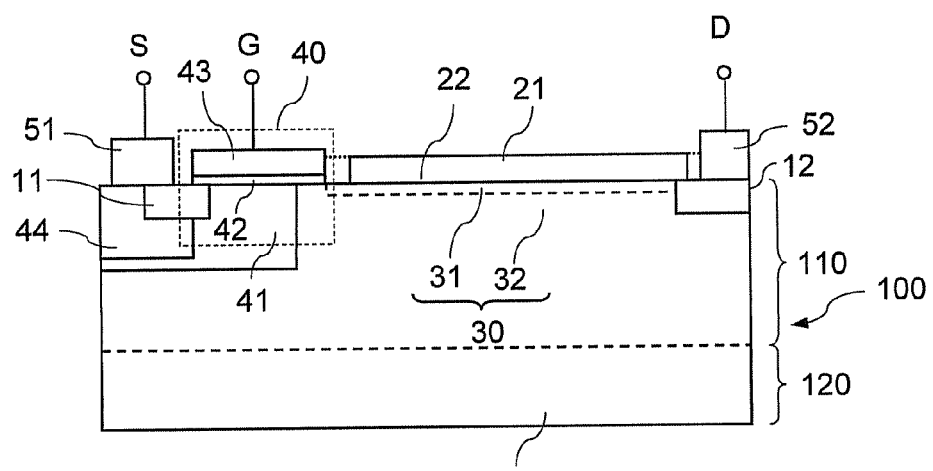

Referring to FIG. 11, that illustrates a modification of the component illustrated in FIG. 10, it is also possible to select the basic doping of the semiconductor body 100 such that it corresponds to the doping of the drift zone 30, or such that—when the drift zone 30 includes a first and a second drift zone section 31, 32—it corresponds to the doping of the second drift zone section 32. In this component source zone 11, drain zone 12, body zone 41, connection zone 44 and the optionally present first drift zone section 31 are to be produced using implantation and/or diffusion methods. For the rest all explanations made before with reference to the components according to FIGS. 7 and 10 and relating to the channel control layer 21, and the drift zone 30 apply to the component according to FIG. 11 accordingly. Of course, it is also possible in this component to provide a dielectric layer (not shown) between the channel control layer 21 and the drift zone 30, namely in the way it has been explained with reference to FIG. 9.

Referring to FIG. 11 the semiconductor body 100 optionally includes two semiconductor layers: A first semiconductor layer 110 in which the component zones of the transistor are arranged, and having a basic doping that corresponds to the drift zone 30, as well as a second semiconductor layer 120 arranged on the first semiconductor layer 110 and being doped complementarily to the first semiconductor layer 110. The second semiconductor layer 120 is, e.g., a semiconductor substrate, the first semiconductor layer 110 is, e.g., an epitaxial layer arranged on the semiconductor substrate 120.

In a corresponding manner also the components illustrated with reference to FIGS. 7 to 10, in which the basic doping of the semiconductor body in the region in which the component zones are arranged corresponds to the basic doping of the body zone 41, may be realized two-layered with two complementarily doped semiconductor layers.

Figure 12:
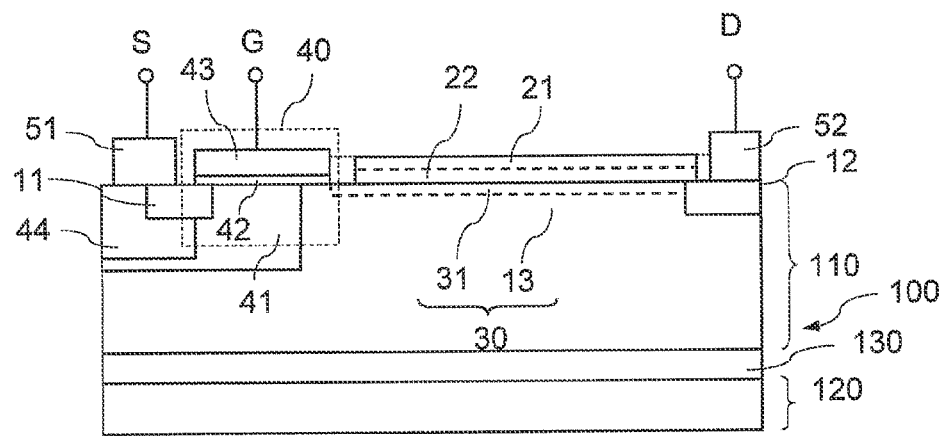

The components may also be realized as so-called SOI components. This is illustrated in FIG. 12 for the component explained before with reference to FIG. 11. However, this principle applies to any other components explained before with reference to FIGS. 7 to 10 accordingly, and also to the components explained in the following. In this SOI component the first semiconductor layer 110, in which the component zones are implemented, is arranged on an insulating layer 130 that separates the first semiconductor layer 110 from the semiconductor substrate 120.

The operating principle of the components explained before with reference to FIGS. 7 to 12 will now briefly be explained. In this connection it is assumed that these transistor components are normally-off components. These components are blocking when an electrical potential applied to the gate electrode 43 is not sufficient to develop an inversion channel in the body zone 41 along the gate dielectric 42, and when a blocking voltage is applied between the drain zone 12 and the source zone 11. In an n-conducting component this blocking voltage is a positive voltage between drain and source, and in a p-conducting component this blocking voltage is a negative voltage between drain and source. When the component is blocking a space charge zone propagates in the drift zone 30 starting from the pn-junction between the drift zone 30 and the body zone 41. If the drift zone 30 includes a first and a second drift zone section 31, 32, the space charge zone propagates starting from the body zone in the second drift zone section 32, where with increasing blocking voltage the first drift zone section 31 is depleted, i.e., charge carriers of the first drift zone section 31 find a corresponding counter-charge in the second drift zone section 32. Through this a conducting channel between source 11 and drain 12 is interrupted.

The doping concentration of the drift zone 30 and the first and second drift zone section 31, 32, respectively, are, e.g., in the range between $10^{13}$ cm$^{-3}$ and $10^{15}$ cm$^{-3}$. The doping concentrations of the source zone 11 and the drain zone 12, are, e.g., in the range of $10^{19}$ cm$^{-3}$ to $10^{21}$ cm$^{-3}$, and the doping concentrations of the body zone 41 is, e.g., in the range of $10^{17}$ to $10^{18}$ cm$^{-3}$. With a two-part drift zone 30 the doping concentrations of the first and second drift zone sections 31, 32 are, in one embodiment, adapted to one another such that these two sections completely deplete one another when the component is blocking, i.e. they compensate each other.

For explanation purposes it is assumed that drift zone 30 is p-doped or includes a p-doped inversion section having a doping within the doping range of $10^{13}$ cm$^{-3}$ to $10^{15}$ cm$^{-3}$ explained before. For silicon as the material of the drift zone the barrier height $q\Phi_{Bp}$ that according to equations (2a) and (1a) has to be exceeded for development of an inversion channel is between 0.72 eV and 0.84 eV. These barrier heights correspond to 0.65% and 0.75%, respectively, of the band gap of 1.12 eV. For this, work functions $q\Phi_a$ between less than 4.45 eV and less than 4.33 eV are required. In this component the DLC layer explained before having a work function of 4.17 eV would be suitable as the amorphous semi-insulating channel control layer 21.

For GaAs (having a band gap of $E_g$=1.42 eV, an electron affinity of 4.07 eV, an intrinsic concentration of 1.8·10$^6$ cm$^{-3}$, and an equivalent state density $N_V$ at the valence band edge of 7·10$^{18}$ cm$^{-3}$) as the material of the drift zone a barrier height for the onset of the strong inversion of $q\Phi_{Bp}$=1.28 eV is obtained at an acceptor concentration $N_A$=1·10$^{15}$ cm$^{-3}$ of the drift zone or the first drift zone section 31, respectively. This corresponds to 90% of the band gap $E_g$. The required work function according to equation (6a) is 4.21 eV or less.

For SiC of the 6H polytype (having a band gap of 3.05 eV, an electron affinity of 3.77 eV, an intrinsic concentration of 1.6·10$^6$ cm$^{-3}$, and an equivalent state density $N_V$ at the valence band edge of 2.5·10$^{19}$ cm$^{-3}$) as the material of the drift zone a barrier height for the onset of the strong inversion of $q\Phi_{Bp}$=2.75 eV is obtained at an acceptor concentration $N_A$=1·10$^{15}$ cm$^{-3}$ of the drift zone 30 or the first drift zone section 31, respectively. This corresponds to 90% of the band gap. The required work function according to equation (6a) is 4.07 eV or less.

In the lateral transistor components explained before with reference to FIGS. 7 to 10 channel control zone 21 is arranged above a first side of the semiconductor body 100, which will be referred to as front side in the following. In order to better use a given volume of the semiconductor body 100, and in order to increase the current capability of the component at a given volume of the semiconductor body, the channel control layer 21 as well as the optionally present dielectric layer 22 may be arranged in a trench of the semi-conductor body 100.

Figure 13A:
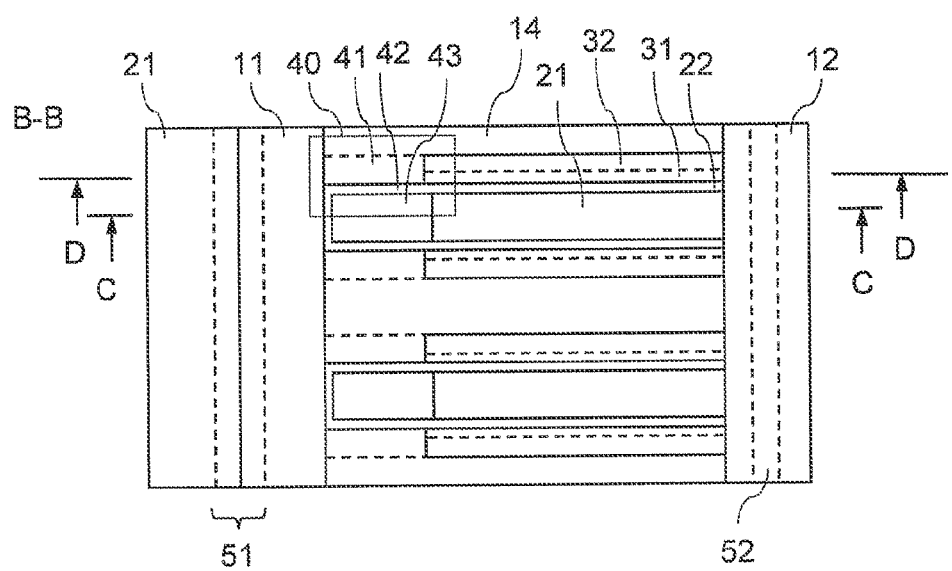
FIG. 13 illustrates a first embodiment of a lateral transistor component having a drift zone arranged in a trench.
Figure 13B:
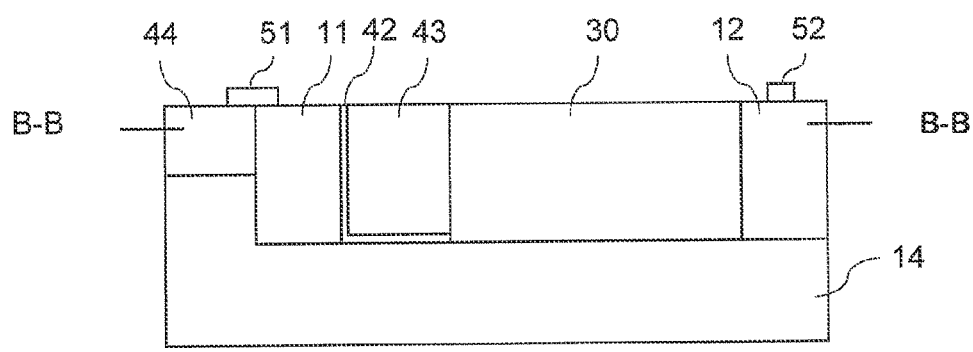
Figure 13C:
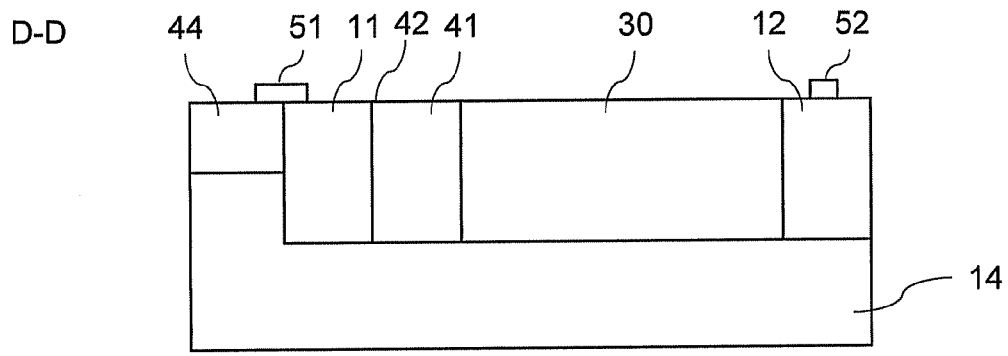

FIG. 13 illustrates such a component by horizontal sections in a section plane B-B (FIG. 13A), as well as by two vertical sections in section planes C-C and D-D. Referring to FIGS. 13B and 13C, in this component source zone 11 and drain zone 12 extend in a vertical direction into the semiconductor body 100 starting from the front side. In the embodiment illustrated body zone 41 and drift zone 30 extend in a vertical direction into the semiconductor body as far as the source zone 11 or the drain zone 12. In this connection it should be mentioned that these component zones may also extend deeper or less deep into the semiconductor body than the source zone 11 and the drain zone 12. In a corresponding manner also gate electrode 43 extends in a vertical direction into the semiconductor body. In this component in a conducting state a conducting channel develops at a vertical interface between the gate dielectric 42 and the body zone 41 between drift zone 30 and source zone 11. In the embodiment illustrated channel control zone 21 directly adjoins gate electrode 43, on the one hand, and drain zone 12, on the other hand, and extends in the vertical direction of the semiconductor body at least as far into the semiconductor body as drift zone 30.

Drift zone 30 and channel control layer 21 may be implemented in any manner explained before, which means, e.g., in such a manner that the work function of the channel control layer 21 and the doping type of the drift zone 30 are adapted to one another such that an inversion channel develops in the drift zone 30, or such that an accumulation channel develops in the drift zone 30. It goes without saying that it is also possible to implement drift zone 30 to have a first and a second drift zone section 31, 32, as it is illustrated in dashed lines in FIG. 13A. Optionally, a dielectric layer 22 may be arranged between channel control layer 21 and drift zone 30.

Referring to FIG. 13A the component includes a plurality of similar structures each having a control structure 40, a gate electrode 43, a gate dielectric 42, and a body zone 41, and having a drift zone 30 with adjacent channel control layer 21, each being arranged between the source zone 11 and the drain zone 12. The gate electrodes 43 of the individual structures are electrically connected with each other, so that a plurality of parallel connected transistors or transistor cells, respectively, are present in the semiconductor body. A current bearing capability of this component increases with increasing number of transistor cells.

In the embodiment illustrated these structures with the control structure 40 as well as the drift zone 30 and the channel control layer 21 are surrounded by a semiconductor zone 40 in a lateral direction perpendicular to the current flow direction, as well as in a vertical direction, semiconductor zone 40 is of the same conductivity type as body zone 41, and its doping concentration may correspond to that of the body zone. This semiconductor zone 40 may result from a basic doping of the semiconductor substrate or the semiconductor layer, respectively, in which the individual component zones of the transistor component are arranged.

The transistor explained before in which a channel controlled by the gate electrode develops in the body zone 41 along a "sidewall" of the gate electrode 43 will also be referred to as sidewall transistor.

Figure 14A:
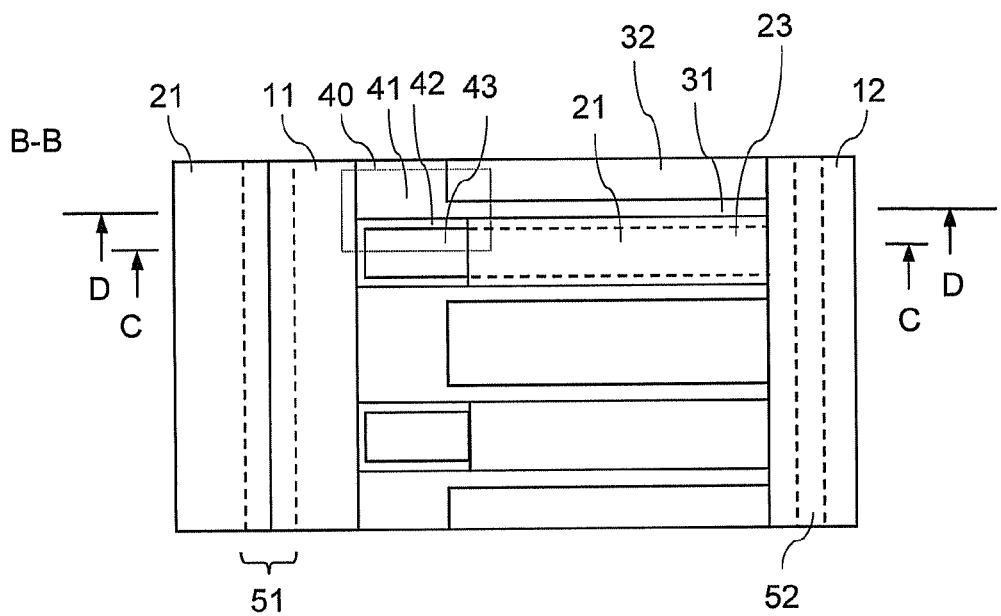
FIG. 14 illustrates a second embodiment of a lateral transistor component having a drift zone arranged in a trench.
Figure 14B:
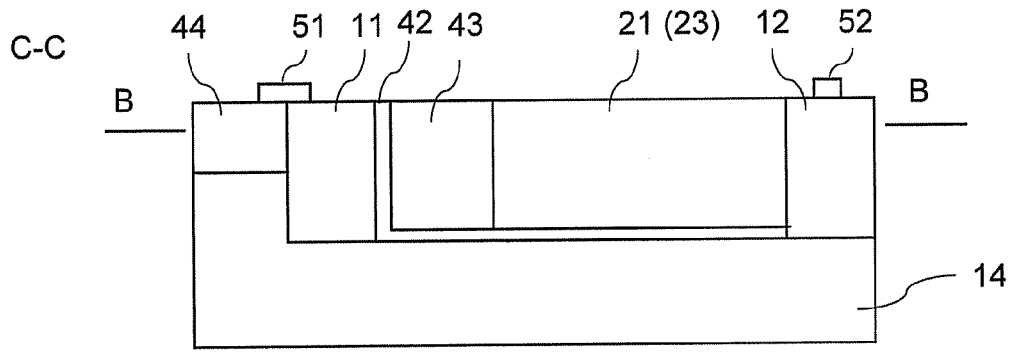
Figure 14C:
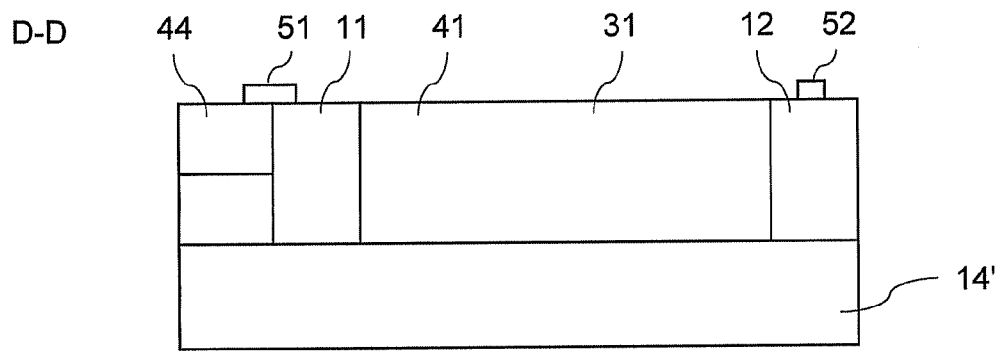

FIGS. 14A to 14C illustrate by a cross-section in a section plane B-B (FIG. 14A) as well as by two vertical sections in section planes C-C and D-D a modification of the component explained with reference to FIG. 13. In the component according to FIG. 14 the drift zone includes a first and a second drift zone section 31, 32, with the first drift zone sections 31 directly contacting the channel control layer 21. Optionally, a dielectric layer 22 may be arranged between the channel control layer 21 and the drift zone 30. In this component the first drift zone section 31 extends to the body zone 41, where the doping type as well as the doping concentration of the first drift zone section 41 may correspond to the doping type and the doping concentration of the body zone 41. In this component the second drift zone section in a lateral direction running perpendicular to the current flow direction extends from a first drift zone section 31 of one transistor cell to the first drift zone section 31 of another transistor cell. In a vertical direction below the individual structures with the control structure as well as the body zones 41 a component zone of the same conduction type as the body zone 41 is arranged. This component zone may result from a basic doping of the semiconductor layer in which the component zones of the transistor component are arranged. The doping concentration of this semiconductor zone 14 may correspond to the doping concentration of the body zone 41.

Figure 15:
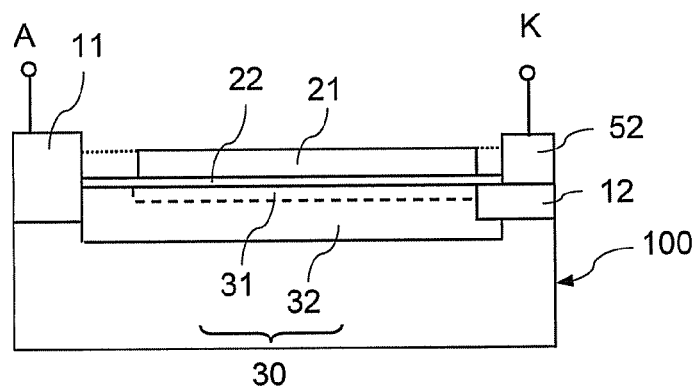
FIG. 15 illustrates a first embodiment of a lateral diode.
Figure 16:
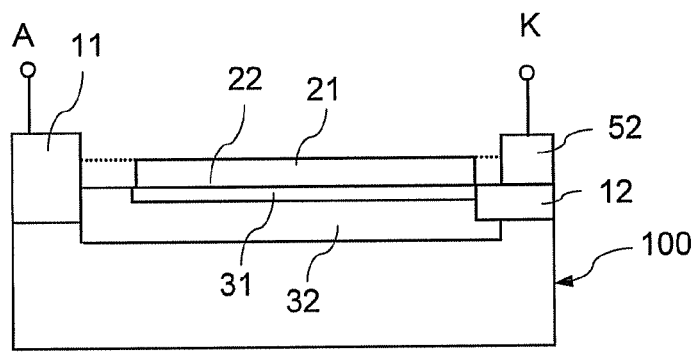
FIG. 16 illustrates a second embodiment of a lateral diode.

Referring to FIGS. 15 and 16 the concept explained before for reduction of the electrical resistance of a drift zone 30 by development of an inversion or accumulation channel using an amorphous semi-insulating layer can also be applied to diodes, for example. FIGS. 15 and 16 illustrate embodiments of lateral diodes by cross sections through a semiconductor body 100. In this diode drift zone 30 directly adjoins the first connection zone 11, and the second connection zone 12. The diode may be implemented as a bipolar diode. In this case the connection zones 11, 12 are doped complementarily to one another. For example, the first connection zone 11 is p-doped, and the second connection zone 12 is n-doped. The doping type of the drift zone 30 is dependent on whether induced by the channel control layer 31 an inversion channel or an accumulation channel should develop in the drift zone 30. Of course it is also possible to provide the drift zone 30 with a first drift zone section 31 (inversion section), and a second drift zone section 32. The inversion section 31 may extend from the first to the second connection zone in the lateral direction. In this case the channel control layer 21 in a lateral direction extends from the first connection zone 11 to the second connection zone 12.

Between the channel control layer 21 and the drift zone 30 a dielectric layer 22 may be provided, as it is illustrated in FIG. 15. In one embodiment, when the doping type of the drift zone 30 is selected such that an inversion channel develops, or when the drift zone 30 includes two drift zone sections 31, 32, this dielectric layer 22 may be omitted, as it is illustrated in FIG. 16.

The diode may be implemented as a Schottky diode. In this case one of the connection zones, such as the first connection zone 11, is made of a Schottky metal, while the other connection zone, such as the second connection zone 12, is n-doped. The explanations given before in connection with the transistors or bipolar diodes and concerning the implementation of the drift zone 30 and the channel control layer 21 do also apply to the Schottky diode accordingly.

It goes without saying that a drift zone 30 with a channel control layer 21 of an amorphous semi-insulating semiconductor material, and arranged adjacent to the drift zone may also be provided in vertical semiconductor components, in one embodiment in vertical transistors. Embodiments of such vertical transistors having a drift zone 30 and a channel control layer 21 of an amorphous semiconductor material will be explained in the following with reference to FIGS. 17 to 22. In these components the source zone 11 and the drift zone 12, or the first and the second connection electrodes 51, 52, respectively, are arranged distant to one another in a vertical direction of the semiconductor body 100. In an equivalent manner in these components the drift zone 30, and the channel control layer 21 arranged adjacent to the drift zone 30, extend in a lateral direction of the semiconductor body 100 between the control structure 40 and the drain zone 12. In the components illustrated in FIGS. 17 to 20 the control structure is a lateral control structure. Here, source zone 11 is arranged distant to the channel control layer 21 in a lateral direction of the semiconductor body 100. The gate electrode 43 is arranged above the front side 101 of the semiconductor body, and is insulated from the body zone 41 by the gate dielectric 42. In this component the channel control layer 21 is arranged in a trench of the semiconductor body and may extend to the source electrode 51 and the gate electrode 43—as illustrated.

In accordance with the explanations given before the drift zone 30 and the channel control layer 21 may be adapted to one another such that an accumulation channel or an inversion channel develops in the drift zone 30. Of course there is also the possibility to optionally provide a dielectric layer 22 between the channel control layer 21 and the drift zone 30. In the components illustrated in FIGS. 17 and 18 drift zone 30 is doped complementarily to body zone 41, and the drift zone 30 and the channel control layer 21 are adapted to one another such that an accumulation channel develops in the drift zone 30.

Figure 17:
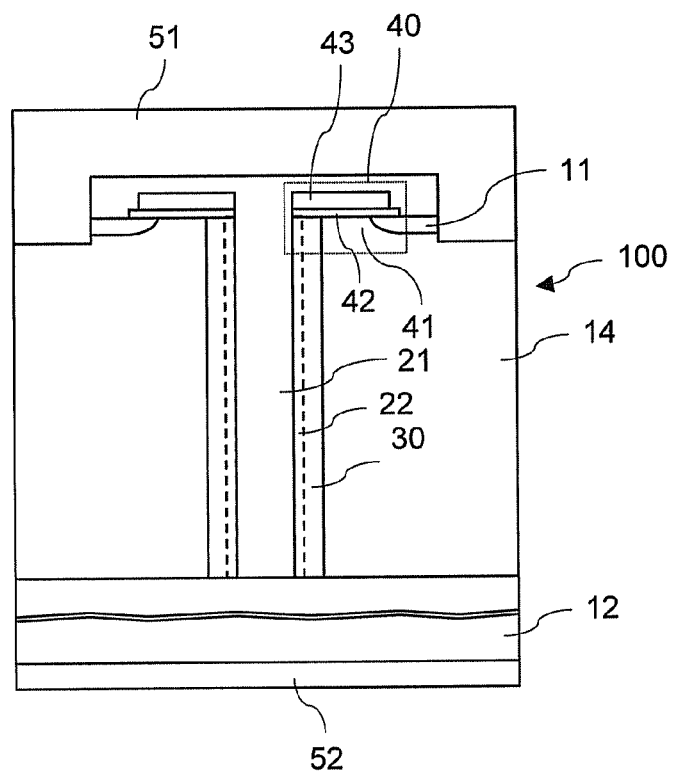
FIGS. 17 to 22 illustrate by means of cross-sections through a semiconductor body embodiments of vertical transistor components.
Figure 18:
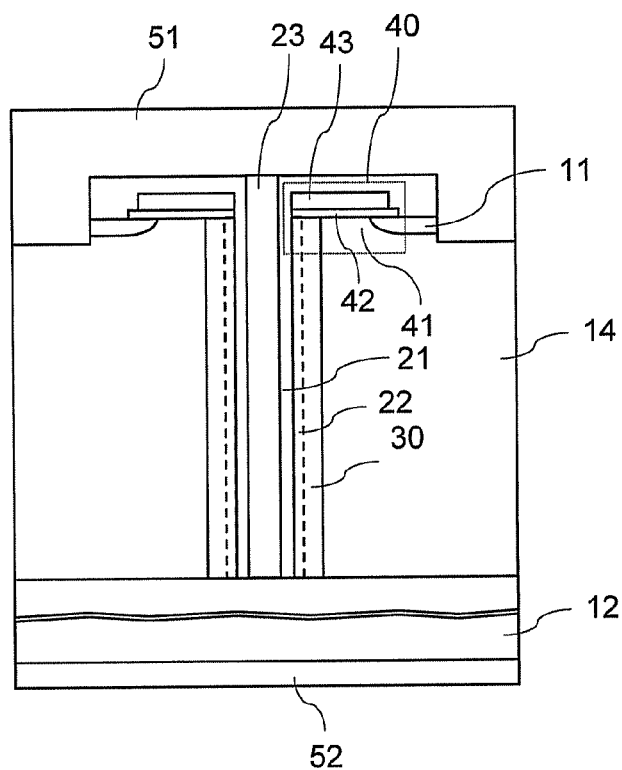

In the vertical transistor components illustrated in FIGS. 17 to 22 drift zone 30 is arranged on both sides of the trench with the channel control layer 21. Referring to FIG. 18, it is in this connection possible to implement channel control layer 21 such that it does not completely fill the trench, but that it is only arranged at the sidewall of the trench. The rest of the trench may be filled with a filling material 23. This filling material is, for example, an undoped silicon oxide (USG), or an organic material, such as a polyimide, benzo-cyclobuthene (BCB), an epoxy material or a silicone.

In the components illustrated in FIGS. 17 and 18 the component zone that is doped complementarily to the drift zone 30 extends from the source zone 11 to the drain zone 12 along the drift zone. Concerning its doping type and its doping concentration this component zone 14 may correspond to the body zone 41. In this component drift zone 30 and the further component zone 14 deplete one another when the component blocks, so that a high voltage blocking capability is achieved.

Figure 19:
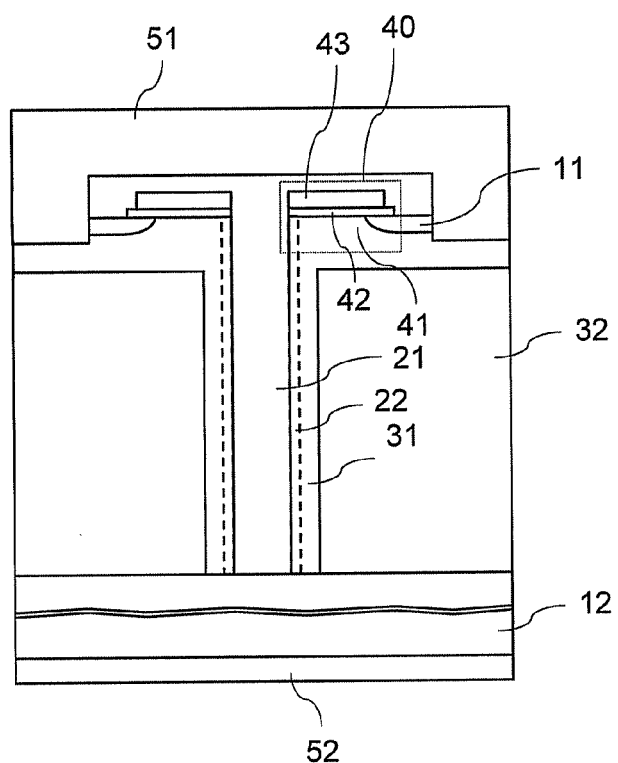
Figure 20:
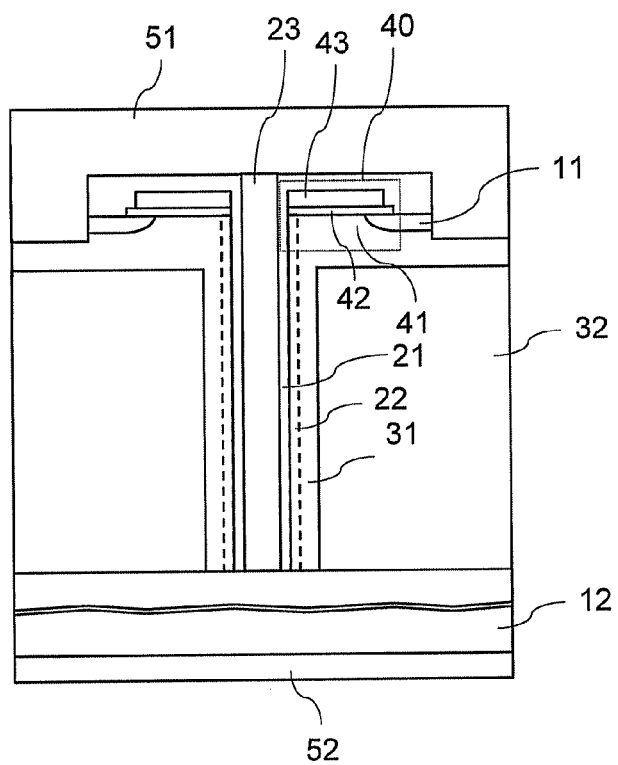

In the components illustrated in FIGS. 19 and 20 drift zone 30 includes a first drift zone section 31 (inversion section), and a second drift zone section 32. In this component the inversion section 31 is implemented such that it extends in a vertical direction from the drain zone 12 to the body zone 41. The doping concentration of the first drift zone section 31 may correspond to the doping concentration of the body zone 41. In accordance with the explanations given with reference to FIGS. 17 and 18 the trench with the channel control layer 21 may completely be filled with the channel control layer. Alternatively there is the possibility to partly fill the trench with a filling material 23, as it is illustrated in FIG. 20.

Of course, there is optionally the possibility to provide a dielectric layer 22 between the channel control layer 21 and the drift zone 30 in the components according to FIGS. 19 and 20.

Figure 21:
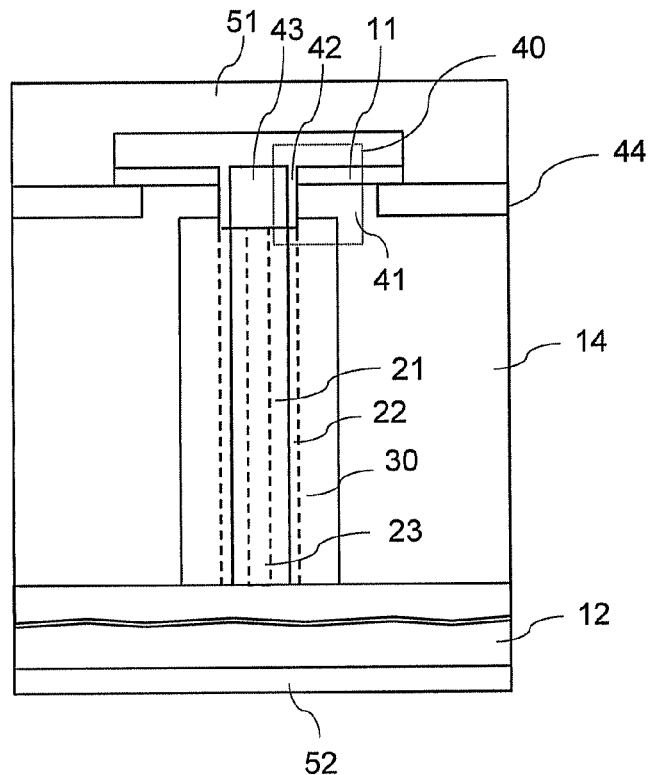
Figure 22:
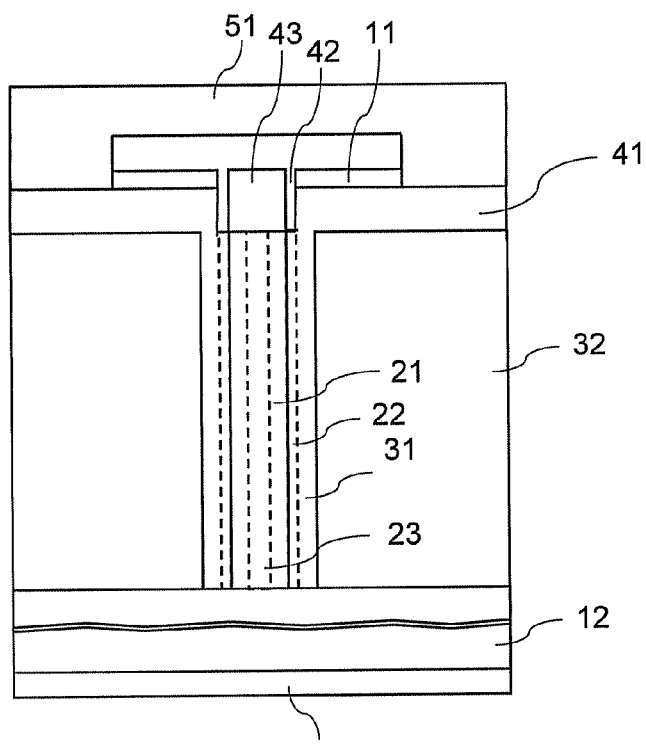

FIGS. 21 and 22 illustrate embodiments of vertical transistor components in which the control structure 40 has a so-called trench structure; here the gate electrode 43 is arranged in a trench of the semiconductor body 100 and is arranged adjacent to the body zone 41 in the lateral direction. In the embodiments illustrated the gate electrode 43 is arranged above the channel control layer 21 in the vertical direction of the semiconductor body. The explanations given before with reference to FIGS. 17 to 20 concerning the channel control layer 21 and the drift zone 30 do also apply accordingly to the components illustrated in FIGS. 21 and 22. In the component illustrated in FIG. 21 drift zone 30 is doped such that an accumulation channel develops in the drift zone, i.e. drift zone 30 is doped complementarily to the body zone 41. In the component illustrated in FIG. 21 the drift zone 30 includes a first and a second drift zone section 31, 32, with a first drift zone section 31 extending from the body zone 41 to the drain zone 12, where the doping concentration of the first drift zone section 31 may correspond to the doping concentration of the body zone 41. Optionally a dielectric layer 22 may be arranged between the channel control layer 21 and the drift zone 30 in the components illustrated in FIGS. 21 and 22. Further, the trench with the channel control layer 21 may optionally be partly filled with a filling material 23.

Figure 23:
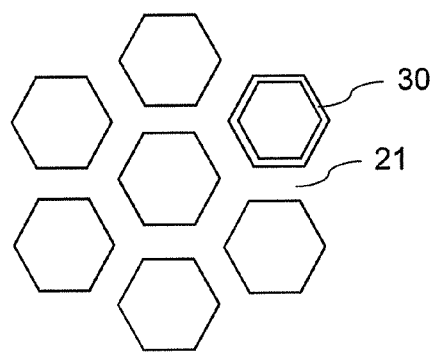
FIG. 23 schematically illustrates by means of a cross-section in a horizontal section plane through a semiconductor body a transistor component having a hexagonal transistor cell geometry.
Figure 24:
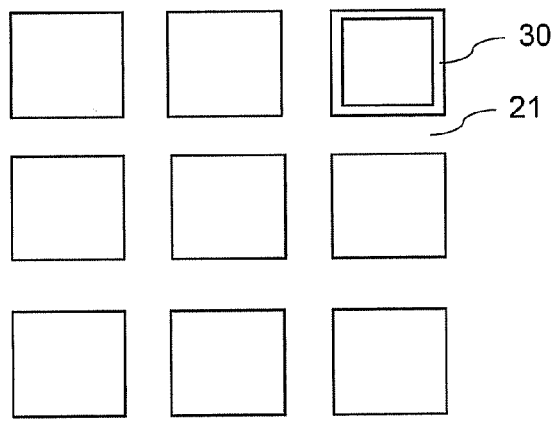
FIG. 24 schematically illustrates by means of a cross-section in a horizontal section plane through a semiconductor body a transistor component having a rectangular transistor cell geometry.
Figure 25:
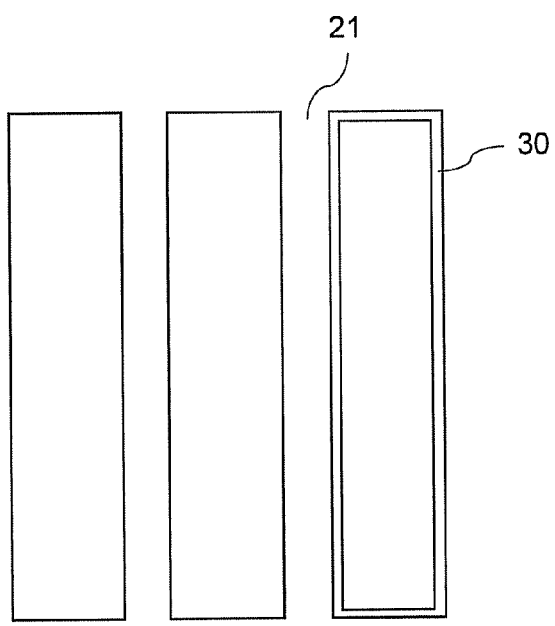
FIG. 25 schematically illustrates by means of a cross-section in a horizontal section plane through a semiconductor body a transistor component having a stripe-shaped transistor cell geometry.

For increasing the current capability of the component a plurality of the structures or transistor cells, respectively, illustrated with reference to FIGS. 17 to 22 may be arranged in the semiconductor body 100, with these structures being connected in parallel. In this connection the geometry of the individual transistor cells is substantially determined by the geometry of the trench, in which the channel control layer 21 is arranged. Referring to FIGS. 23 to 25 any geometries are suitable for this. FIG. 23 schematically shows a hexagonal cell geometry. In this connection the channel control layer 21 is arranged in a trench between hexagonal "semiconductor islands", where the drift zone is arranged in these hexagonal semiconductor islands, which is sketched at one position in FIG. 23. Further, the trench with the channel control layer 21 may also be arranged between quadratic or rectangular semiconductor islands, from which the rectangular geometry of the cell field illustrated in FIG. 24 results. Referring to FIG. 25, there is also the possibility to implement the trenches with the channel control layer 21 as elongated trenches between stripe-shaped semiconductor isles.

Figure 26:
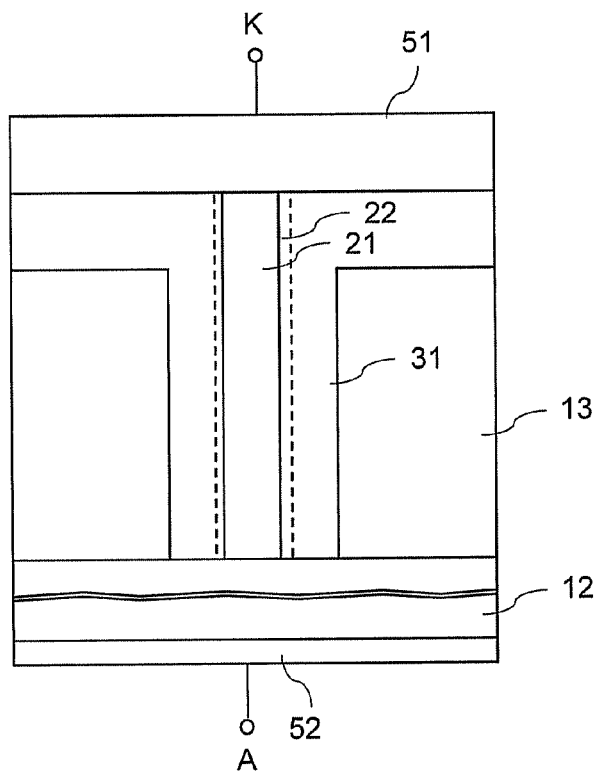
FIGS. 26 to 28 illustrate by means of cross-sections through a semiconductor body embodiments of vertical transistor components.
Figure 27:
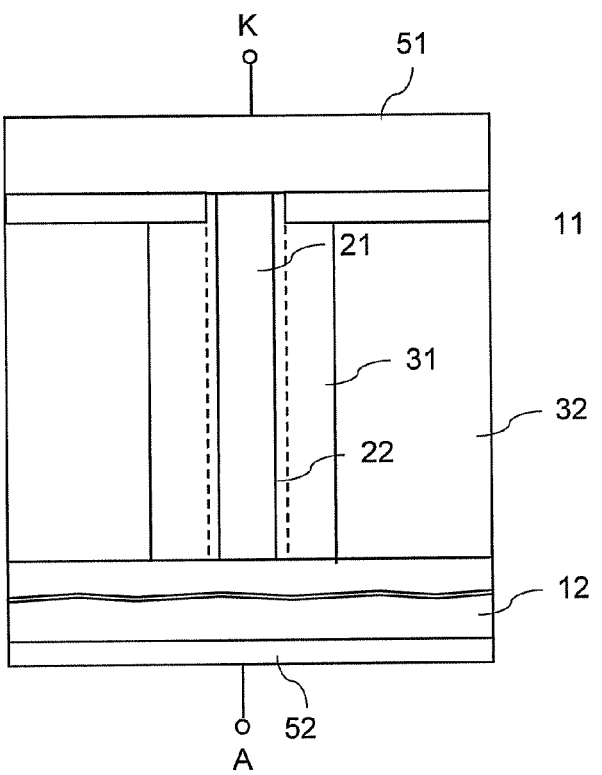
Figure 28:
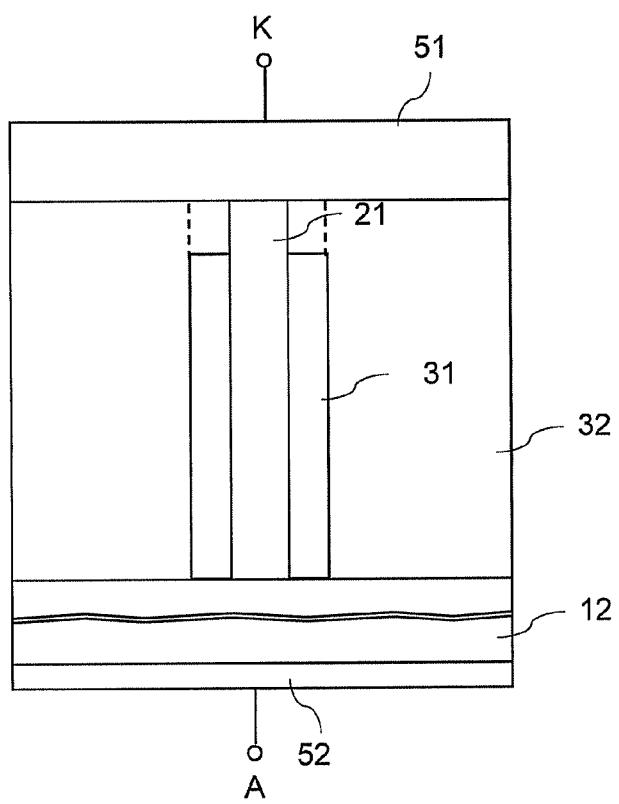

Referring to FIGS. 26 to 28, in the same manner as vertical transistors vertical diodes may of course be implemented as well. FIG. 26 illustrates by a cross section through the semiconductor body 100 an embodiment of a vertical bipolar diode having a first and a second connection zone 11, 12 that are doped complementarily to one another, and that are arranged distant to one another in a vertical direction of the semiconductor body. The first connection zone 11 is, for example, p-doped and forms an anode zone of the component, the second connection zone 12 is, for example, n-doped and forms a cathode zone of the component. The two connection zones 11, 12 are contacted by first and second connection electrodes 51, 52. Drift zone 30 extends in the vertical direction between the first and the second connection zones 11, 12, where the channel control layer 21 is arranged adjacent to the drift zone in the lateral direction. In the embodiment illustrated the channel control layer 21 directly contacts the drift zone 30. Optionally there is the possibility to provide a dielectric layer 22 (illustrated in dashed lines) between the channel control layer 21 and the drift zone 30. In the embodiment illustrated drift zone 30 is implemented with two drift zone sections: A first drift zone section (inversion section) 31, and a second section 22 doped complementarily to the first section. The channel control layer 21 and the first drift zone section 31 are adapted to one another such that an inversion channel develops in the first drift zone section.

FIG. 27 shows a modification of the diode illustrated in FIG. 26. In this component the drift zone 30 is implemented such that an accumulation channel develops in the drift zone. In this component the first connection zone 11 is so highly doped that it acts as a field stop layer at the same time. In a lateral direction this first connection zone 11 extends to the channel control layer 21 or the optionally present dielectric layer, respectively. In the lateral direction of the semiconductor body a complementarily doped semiconductor zone adjoins the drift zone 30, this semiconductor zone causing the drift zone 30 to be completely depleted when the component blocks.

FIG. 28 by a vertical cross section through the semiconductor body 100 illustrates an embodiment of a vertical Schottky diode. In this Schottky diode one of the connection electrodes, the first connection electrode 51 in the embodiment illustrated, is made of a Schottky metal and directly contacts the drift zone 30. In this component the drift zone 30 includes two drift zone sections: A first drift zone section 31 arranged directly adjacent to the channel control layer 21, with the channel control layer 21 and the first drift zone section 31 being adapted to one another such that an inversion channel develops in the first drift zone section 31; and a second drift zone section 32 that is n-doped. A higher n-doped second connection zone 12 contacted by a second connection electrode 52 adjoins the drift zone 30 at a side opposite to the first connection electrode 51. In this connection "higher n-dopes" means that the second connection zone 12 is higher doped then the second drift zone section 32 of the drift zone 30. In the component illustrated the first drift zone section 31 directly adjoins the second connection zone 12 and is distant to the first connection electrode 51. As it is illustrated in FIG. 28 the first drift zone section 31 could also extend to the first connection electrode 51.

In the MOS transistors explained before the gate dielectric 42 of the control structure 40 is a gate dielectric that is usual for MOS transistors and includes, for example, an oxide. The gate electrode 43 includes, for example, of a metal or a highly doped poly crystalline semiconductor material, such as polysilicon. The gate dielectric 42 needs to have a high dielectric strength and a low density of mobile or fixed charges. The maximum break-through field strength of thermally grown oxides is, for example, between 5 MV/cm and 10 MV/cm. At field strengths higher than this breakthrough field strength a Fowler-Nordheim-tunnelling-current across the oxide barrier sets in. This maximum breakthrough field strength limits the allowed gate voltage and, therefore, the charge density that can be set in the inversion in the body zone 41 channel along the gate dielectric. Further, an oxide as the gate dielectric 42 may degrade due to temperature induced mechanical stress, cosmic radiation, or injection of hot charge carriers, where the latter may occur in case of an avalanche breakthrough of a MOSFET, for example.

In order to avoid this problem instead of a dielectric between the gate electrode 43 and the body zone 41 a layer of an amorphous semi-insulating material is provided between the gate electrode 43 and the body zone 41 according to an embodiment. This layer, that together with a suitable control of the gate controls development of a channel in the body zone 41, will be referred to as gate control layer in the following. In this connection the gate control layer may include the same material as the channel control layer 21, and may further be implemented as a common layer together with the channel control layer 21.

All the MOS transistor structures explained before can be modified by replacing the gate dielectric 42 by an amorphous semi-insulating layer accordingly.

Figure 29:
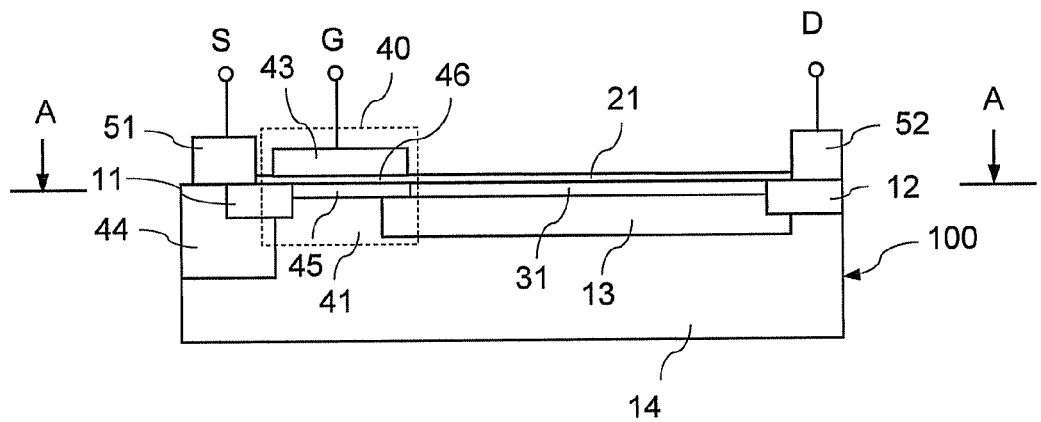
FIG. 29 illustrates by means of a cross-section through a semiconductor body a first embodiment of a transistor component having a planar control structure with an amorphous semi-insulating layer.

FIG. 29 illustrates by a cross section through a semiconductor body 100 an embodiment of a lateral transistor component that is based on the component illustrated in FIG. 10 and that is different from the component according to FIG. 10 in that instead of a gate dielectric 42 an amorphous semi-insulating channel control layer 46 is provided. This channel control layer 46 is implemented as a common layer together with the channel control layer 21. The difference between the control structure 40 of the component according to FIG. 29 and of the component according to FIG. 10 will be explained in the following. The explanations concerning the remaining component parts that have been given for the component according to FIG. 10 apply to the component according to FIG. 29 accordingly.

In the transistor illustrated in FIG. 29 the channel control layer 21 and the first drift zone section 31 of the drift zone 30 are adapted to one another such that an inversion channel develops in the first drift zone section 31. The doping type of the first drift zone section 31 corresponds to the doping type of the body zone 41. In an n-conducting transistor these component zones are p-doped. In order to obtain in normally-off component in the body zone along the gate electrode 43 the control structure 40 includes a channel zone 45 that is higher doped than the first drift zone section 31. Due to this it is prevented that only by the presence of the amorphous semi-insulating gate control layer 46 a conducting channel develops in the body zone 41. In this component such conducting channel in the body zone 41 along the gate electrode 43 only develops when a corresponding drive potential is applied to the gate electrode 43. In an n-conducting transistor this drive potential is a positive voltage relative to source potential, i.e., the potential at the source terminal S, and in a p-conducting component this drive voltage is a negative voltage. In an n-conducting transistor the p-doping concentration of the channel zone 41 is, for example, about between $10^{16}$ $cm^{-3}$ and $10^{17}$ $cm^{-3}$.

The thickness of the gate control layer 46 and also the channel control layer 21 is, for example, in the range of between 50 nm and 500 nm. These values apply to the channel control layers 21 of all components explained before.

All the remaining MOS transistors explained before can be modified in an equivalent manner by replacing the gate dielectric layer 42 by an amorphous semi-insulating gate control layer for 46, and by doping the body zone 41 along the gate control layer 46 at least locally so high that at a gate-source voltage of zero volt no inversion channel is present along the gate control layer 46 in the body zone 41, which means that the component is a normally-off component. Embodiments of such components will shortly be explained with reference to FIGS. 30 to 36 in the following. The components illustrated in these Figures are modifications of components explained before, the explanations given to these components apply to the components according to FIGS. 30 to 36 in an equivalent manner.

Figure 30:
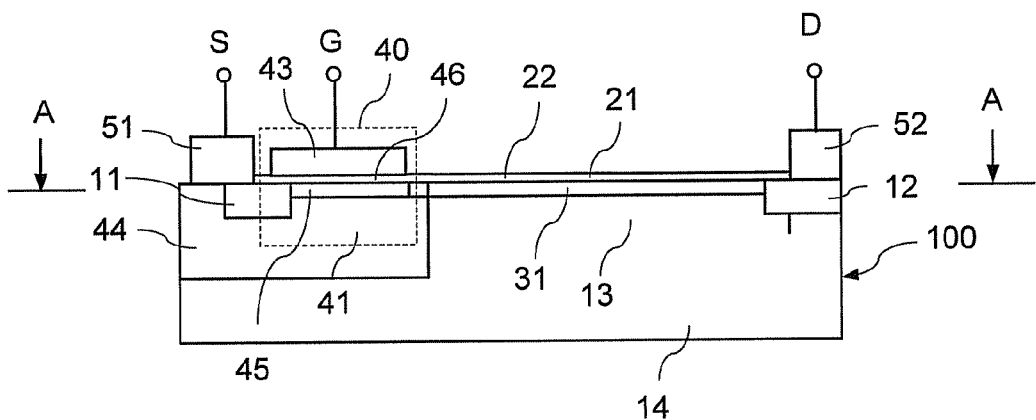
FIG. 30 illustrates by means of a cross-section through a semi-conductor body a second embodiment of a transistor component having a planar control structure with an amorphous semi-insulating layer.

FIG. 30 illustrates a component that is based on the component illustrated in FIG. 11 and having a control structure that is modified by providing an amorphous semi-insulating gate control layer 46.

Figure 31:
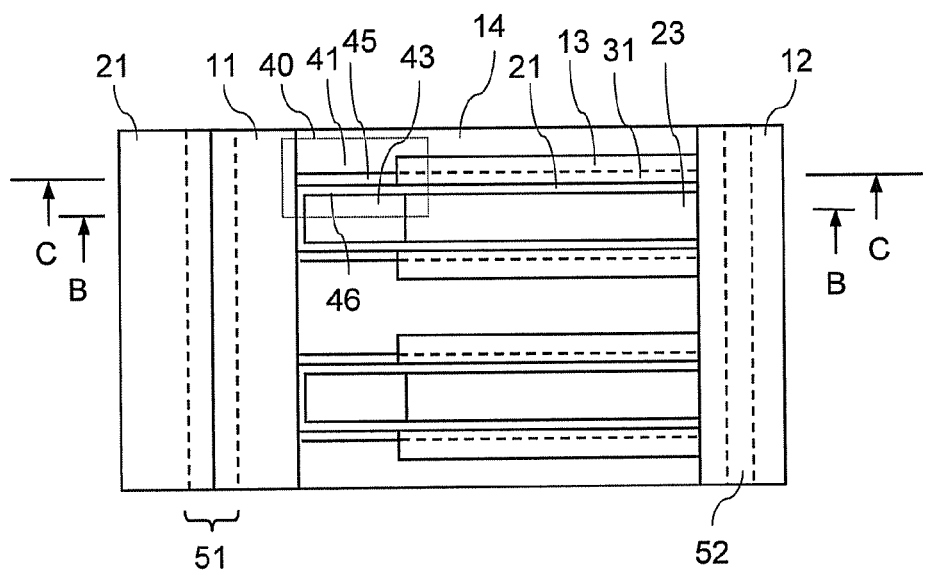
FIG. 31 illustrates a first embodiment of a lateral transistor component having a control structure with an amorphous semi-insulating layer arranged in a trench.

FIG. 31 shows a top view of a sidewall transistor that is based on the sidewall transistor illustrated in FIG. 13. The transistor illustrated in FIG. 31 is different from the one illustrated in FIG. 13 in that the dielectric layer 22 is replaced by an amorphous semi-insulating semiconductor layer that forms the channel control layer 21 along the drift zone 30 and the gate control layer 46 along the body zone 41. In this connection a trench adjoining the gate electrode 43 in the lateral direction and being arranged between two sections of the channel control layer 21 may be filled with a filling material 23. It goes without saying that there is also the possibility to completely fill this trench with the amorphous semi-insulating material of the channel control layer 21 or a gate control layer 46, respectively.

Figure 32:
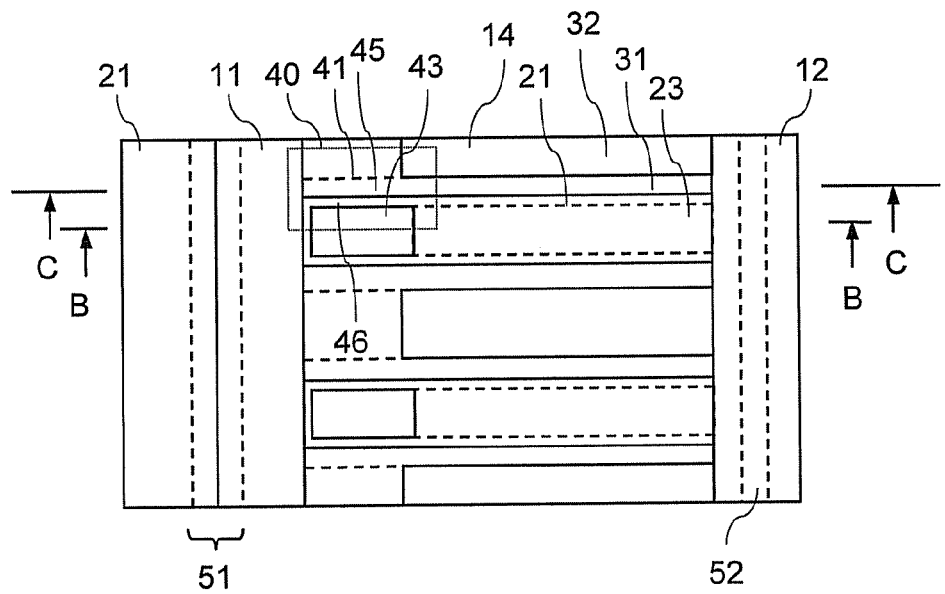
FIG. 32 illustrates a second example of a lateral transistor component having a control structure with an amorphous semi-insulating layer arranged in a trench.

FIG. 32 shows a top view on a semiconductor component modified as compared to the component according to FIG. 14. In the component according to FIG. 32 the control structure 40 includes an amorphous semi-insulating gate control layer 46 instead of a gate dielectric.

Figure 33:
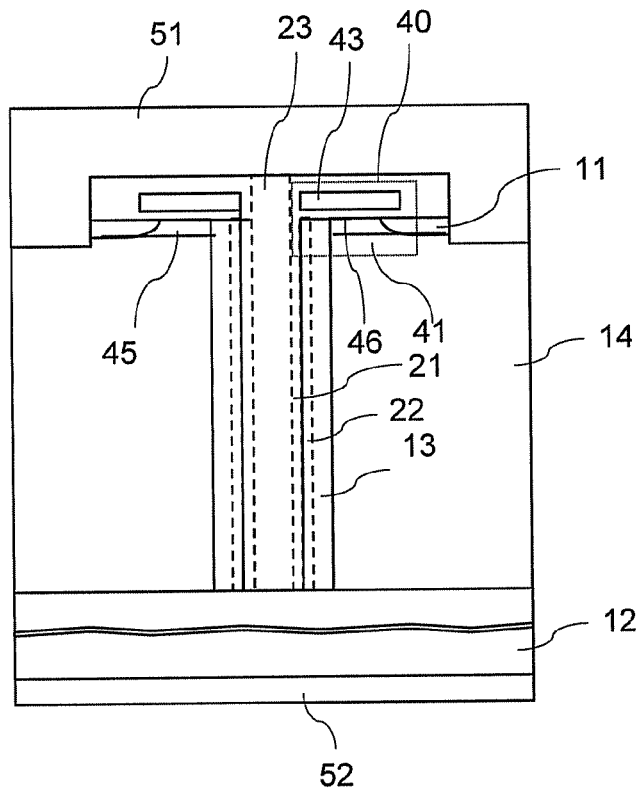
FIGS. 33 to 36 illustrate examples of vertical transistor components having a control structure with an amorphous semi-insulating layer.

FIG. 33 shows a vertical transistor component that is based on the components illustrated in FIGS. 17 and 18, with the control structure 40 of this component as a modification of the components according to FIGS. 17 and 18 includes an amorphous semi-insulating layer as the gate control layer.

Figure 34:
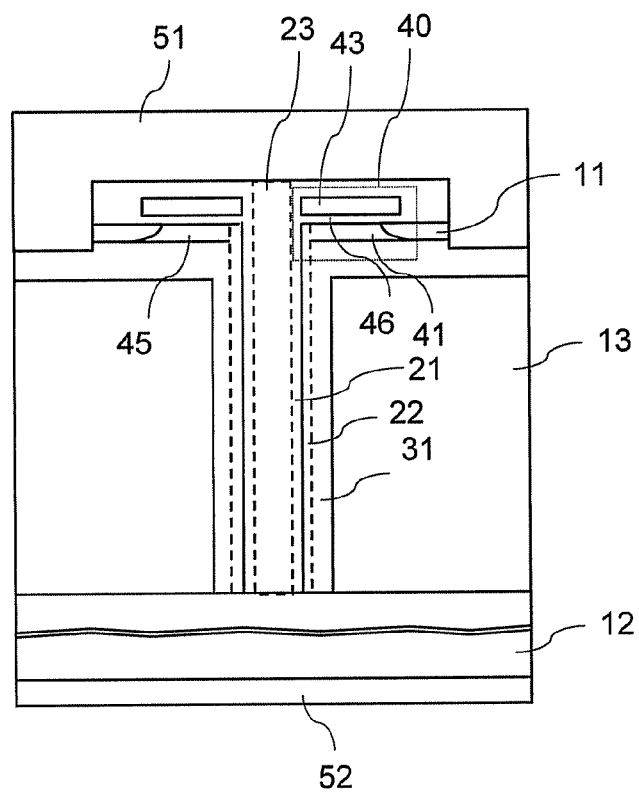
Figure 35:
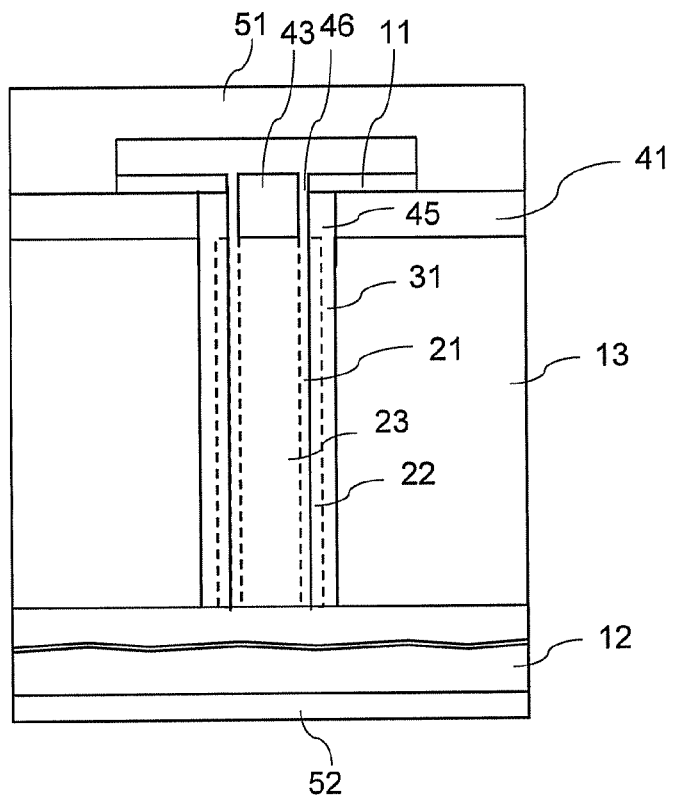

FIG. 34 shows a vertical transistor component that is based on the components illustrated in FIGS. 19 and 20; and FIG. 35 illustrates a vertical transistor component that is based on the component illustrated in FIGS. 21 and 22.

Figure 36:
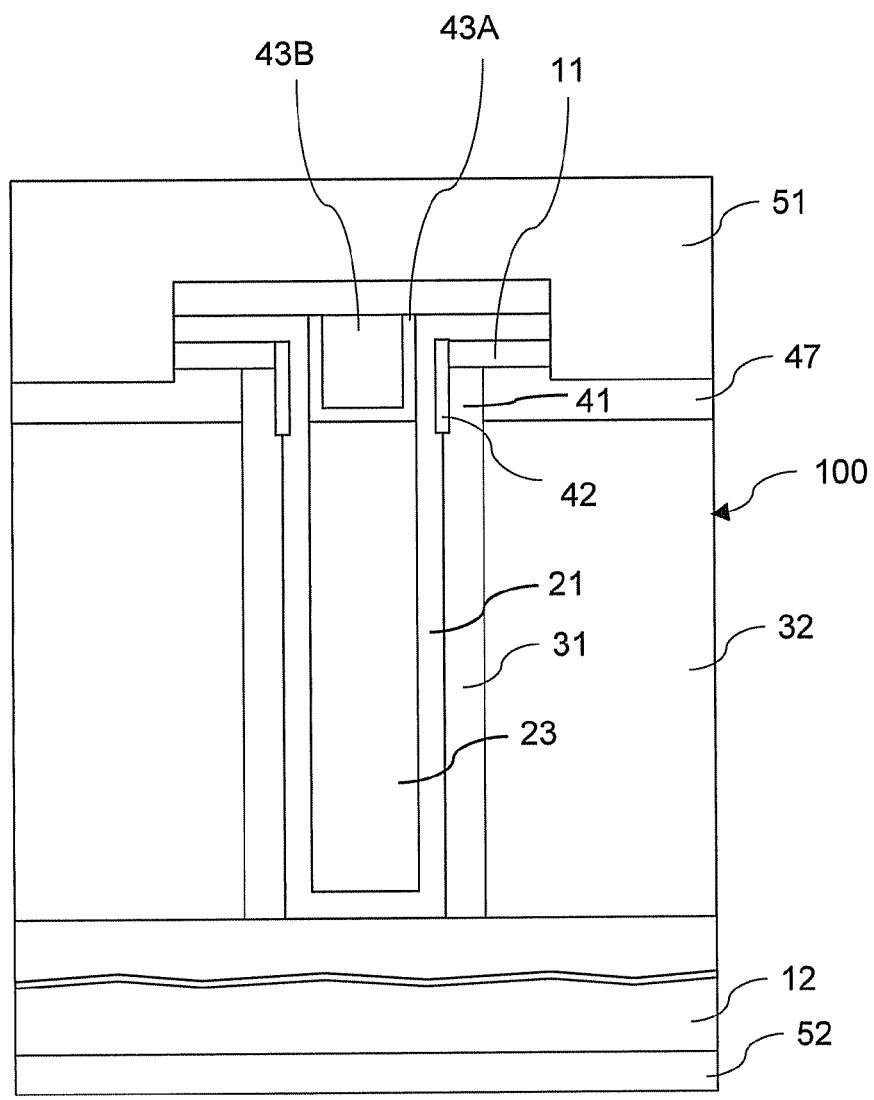

FIG. 36 by a vertical cross section through a semiconductor body 100 illustrates a vertical transistor having an amorphous semi-insulating channel control layer 21. In this component the drift zone includes a first and a second drift zone section 31, 32, where the first drift zone section 31 directly adjoins the body zone 41, and where this first drift zone section 31 and the body zone 40 are equal concerning the doping type and the doping concentration. A source electrode 51 contacts the source zone 11 and via a higher doped connection zone 44 also the body zone 41. In the component illustrated the gate electrode 43 includes two gate electrode sections 43A, 43B, of different materials, in one embodiment of different metals. However, the two-part implementation of the gate electrode 43 is only optional. It goes without saying that there is also the possibility to provide a single-part gate electrode. This gate electrode may include a metal or a polycrystalline semiconductor material, such as polysilicon.

A possible method for producing a component according to FIG. 36 will be explained with reference to FIGS. 37A to 37M in the following. These Figures each show a vertical cross section through the semiconductor body 100 during different steps of the production method.

Figure 37A:
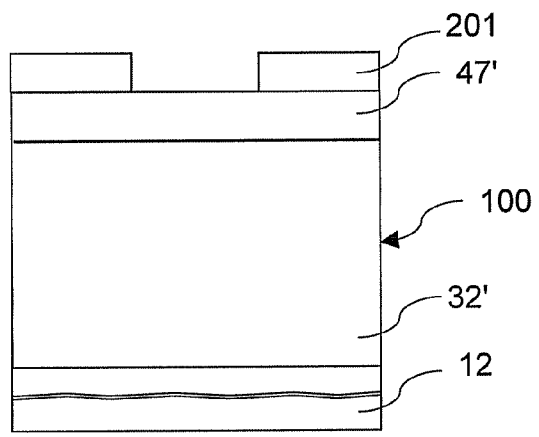
FIG. 37 illustrate an embodiment of a method for producing a component according to FIG. 36.
Figure 37B:
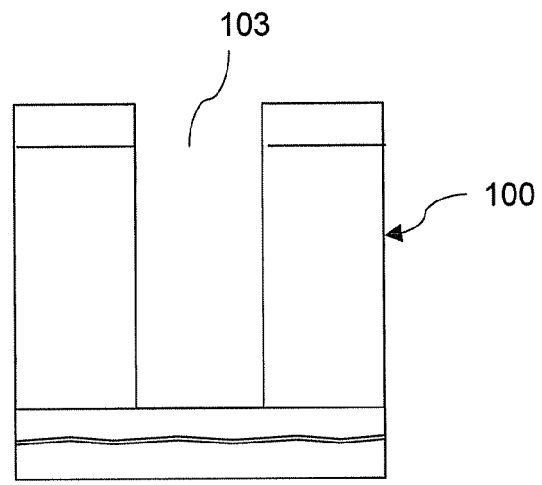
Figure 37C:
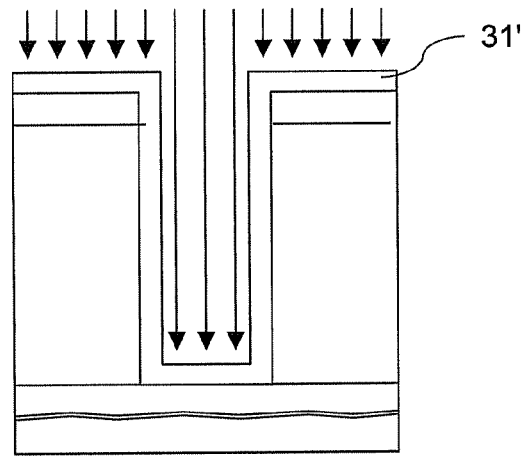

Referring to FIG. 37A the method starts with providing a semiconductor body 100 having differently doped semiconductor layers: a first layer forming the second connection zone 12, a second layer 32' forming the later second drift zone section, as well as a third layer 44' forming the later connection zone 44. A structured etching mask is arranged on the side of the semiconductor body 100 that is opposite to the second connection zone, or drain zone 12, respectively, the etching mask being a hard mask, for example. Using this hard mask a trench 103 is subsequently etched in the semiconductor body. This trench is, for example, produced using an isotropic etching method, namely such that trench 103 in the vertical direction extends to the second connection zone 12. In this connection it should be mentioned that the second connection zone 12 is, for example, formed by a semiconductor substrate, while the semiconductor layer 32' and the semiconductor layer 44' are epitaxial layers, for example. Referring to FIG. 37C, after producing the trench 103 a semiconductor layer 31' is produced overall, i.e. on the sidewalls and the bottom of the trench as well as on the front side of the semiconductor body 100. This semiconductor layer 31' forms the later first drift zone section 31 and has a corresponding doping. The semiconductor layer 31' is, for example, deposited using an epitaxial method.

Figure 37D:
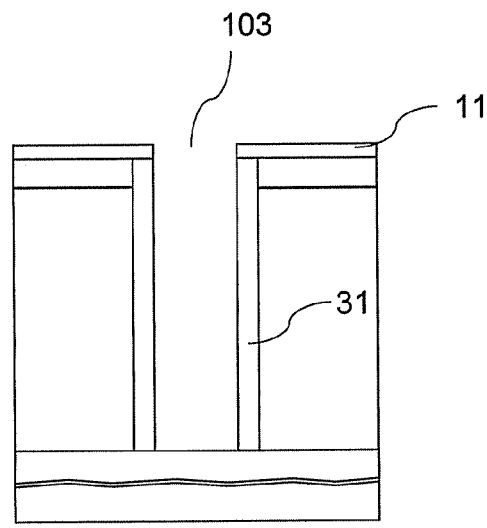

Subsequently the semiconductor layer 31' is removed from the bottom of the trench as well as in the region of the front side of the semiconductor body, so that the semiconductor layer only remains at the sidewalls of the trench 103 where it forms the first drift zone section 130. The result of this is illustrated in FIG. 37D. Further, after etching back the semiconductor layer 31' dopants are implanted into the front side of the semiconductor body 100 for producing the source zone 11.

Figure 37E:
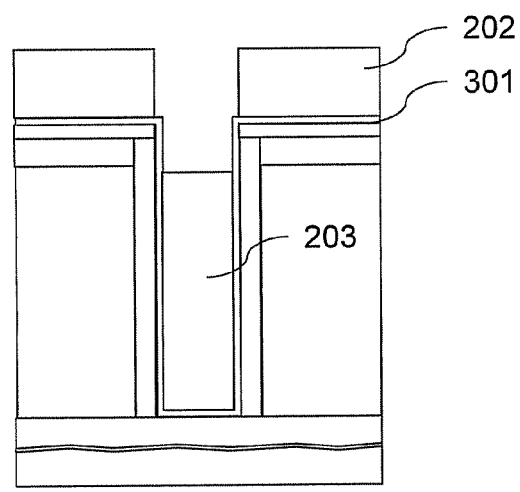
Figure 37F:
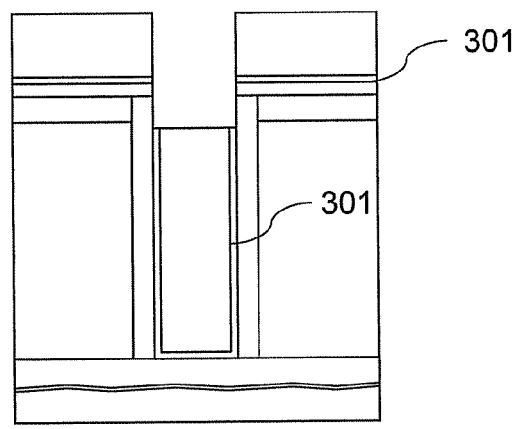
Figure 37G:
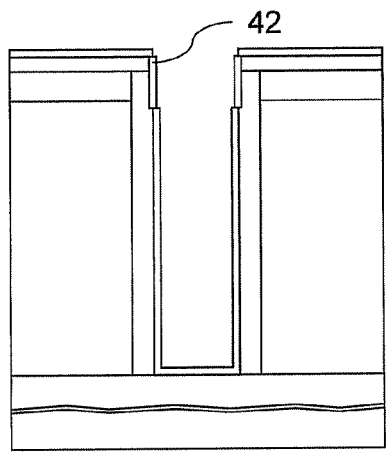

During further method steps that are illustrated in FIGS. 37E to 37G the gate dielectric 42 is formed. This gate dielectric 42 is, for example, produced using an oxidation method. In order to achieve a local oxidation of the semiconductor body prior to the oxidation step a protection layer 301 is produced that leaves only those regions of the semiconductor body uncovered in which the gate dielectric layer 42 is to be produced. Referring to FIG. 37E producing this protection layer 301 includes producing a protection layer on all surfaces in the trench 103 as well as on the front side of the semiconductor body, and referring to FIG. 37F locally removing this protection layer in those regions of sections of the sidewalls of the trench in which the gate dielectric 42 is to be produced. This locally removing the protection layer is, for example, performed by using a resist mask arranged above the front side of the protection layer 301, and by filling the trench up to the level of such sidewall regions in which the gate dielectric layer 43 is to be produced.

Referring to FIG. 37G a local oxidation of the semiconductor body in uncovered regions of the sidewalls of the trench is performed, so that the gate dielectric layer 42 results.

Figure 37H:
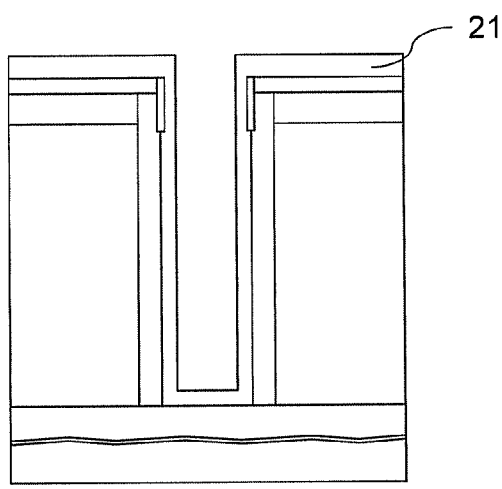
Figure 37I:
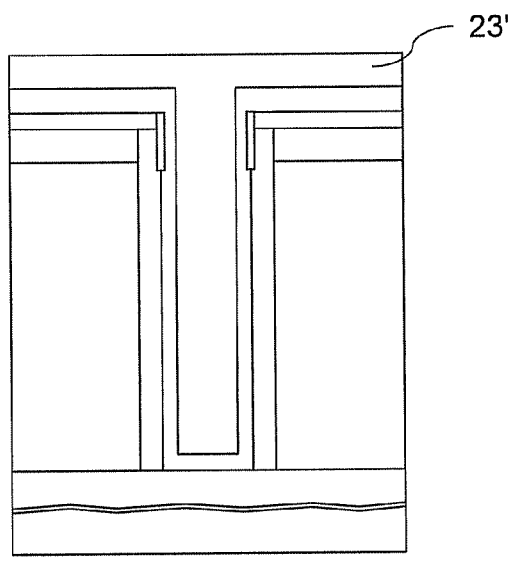
Figure 37J:
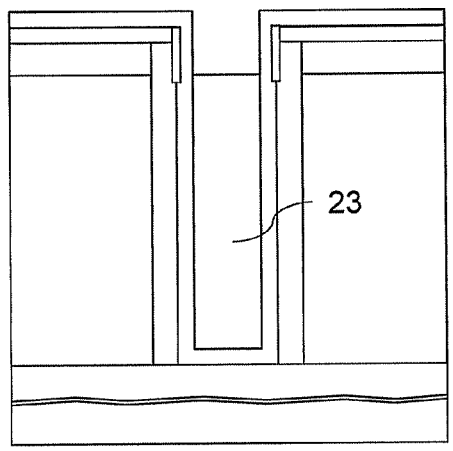

Referring to FIG. 37H subsequently the amorphous semi-insulating semiconductor layer 21 is produced. Producing this semi-insulating layer in this embodiment is performed such that the layer only covers the bottom and the sidewalls of the trench, but does not completely fill the trench. In the method illustrated the trench is filled with a filling material 23 that, referring to FIG. 37I, is first deposited overall, and that, referring to FIG. 37J, is subsequently removed to such an extend or etched back, respectively, that it fills a lower region of the trench, but leaves the trench in the region of the gate dielectric 42 uncovered.

Figure 37K:
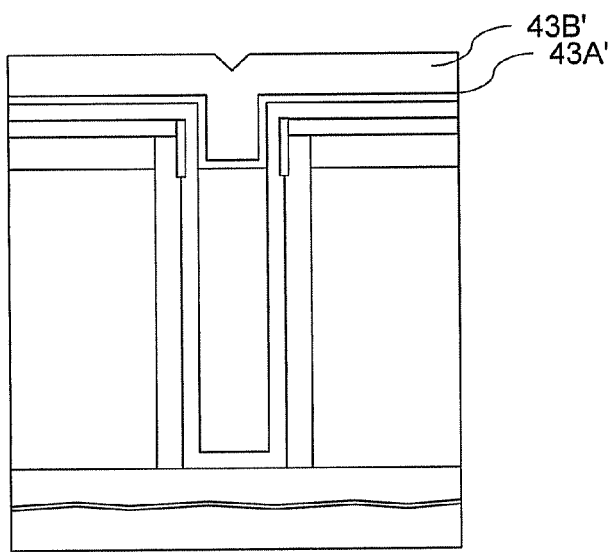
Figure 37L:
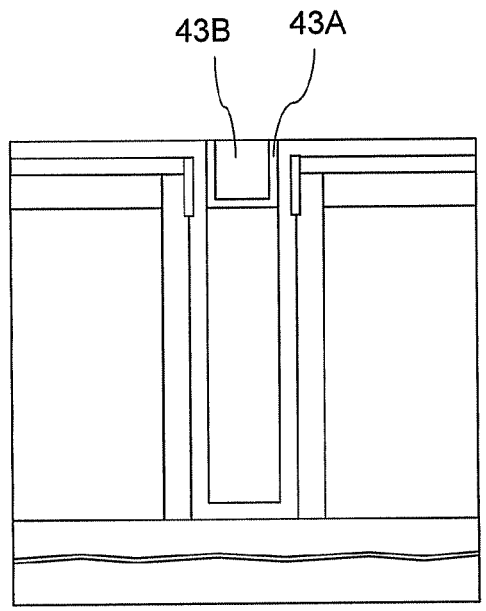

Referring to FIGS. 37K and 37L subsequently the gate electrode is produced. For this, successively two electrically conducting layers, such as a titanium layer 43A' and an aluminum layer 43B', are deposited. Subsequently, these two layers are removed from regions above the front side of the semiconductor body. For this an etching or a polishing method, such as a CMP method, is suitable, for example.

Figure 37M:
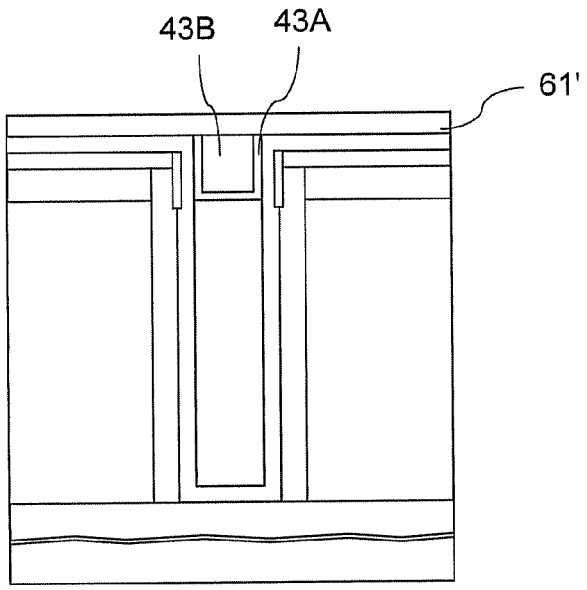

Referring to FIG. 37M, subsequently an insulation layer 61' is produced that at least covers the gate electrode 43A, 43B and serves to electrically insulate the gate electrode from the subsequently produced source electrode 51. Subsequently a contact hole to the source zone 11 and the connection zone 44 is produced, for example using an etching method, wherein in this contact hole in a further method step source electrode 51 is produced, the result of which is illustrated in FIG. 36.

Finally it should be mentioned that features that have been explained with reference to one of the Figures explained before may be combined with features of other figures, even if this not explicitly been mentioned in the explanation before.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:
1. A semiconductor component, comprising:
a drift zone arranged between a first and a second connection zone, the drift zone having a doping concentration; and
a channel control layer of an amorphous semi-insulating material arranged adjacent to the drift zone such that a work function of the amorphous semi-insulating material and the doping concentration of the drift zone result in the development of either an inversion channel or an accumulation channel in the drift zone along the channel control layer,
wherein the drift zone comprises a first drift zone section of a first conduction type, and a second drift zone section of a second conduction type that is complementary to the first conduction type, the first drift zone section being arranged between the second drift zone section and the channel control layer.

2. The semiconductor component of claim 1, wherein the work function of the amorphous semi-insulating material and the doping concentration of the drift zone are adapted to one another such that an inversion channel develops in the first drift zone section along the channel control layer.

3. The semiconductor component of claim 1, wherein the channel control layer directly adjoins the second drift zone section.

4. The semiconductor component of claim 1, wherein a dielectric layer is arranged between the channel control layer and the second drift zone section.

5. A semiconductor component, comprising:
- a drift zone arranged between a first and a second connection zone, the drift zone having a doping concentration; and
- a channel control layer of an amorphous semi-insulating material arranged adjacent to the drift zone such that a work function of the amorphous semi-insulating material and the doping concentration of the drift zone result in the development of either an inversion channel or an accumulation channel in the drift zone along the channel control layer,
- wherein the drift zone, the first connection zone and the second connection zone are arranged in a semiconductor body,
- wherein the first and the second connection zone are arranged distant to one another in a vertical direction of the semiconductor body, and
- where the channel control layer is arranged in a trench of the semiconductor body.

6. A transistor component, comprising:
- a drift zone arranged between a source zone and a drain zone, the drift zone having a doping concentration;
- a body zone arranged between the source zone and the drift zone;
- a gate electrode arranged adjacent to the body zone;
- a channel control layer of an amorphous semi-insulating material arranged adjacent to the drift zone such that a work function of the amorphous semi-insulating material and the doping concentration of the drift zone result in the development of either an inversion channel or an accumulation channel in the drift zone along the channel control layer; and
- an amorphous semi-insulating layer arranged between the gate electrode and the body zone,
- wherein the amorphous semi-insulating layer and the channel control layer are formed as a common layer.

7. An integrated circuit having a semiconductor component, comprising:
- a drift zone arranged between a first and a second connection zone, the drift zone having a doping concentration; and
- a channel control layer of an amorphous semi-insulating material arranged adjacent to the drift zone such that a work function of the amorphous semi-insulating material and the doping concentration of the drift zone result in the development of either an inversion channel or an accumulation channel in the drift zone along the channel control layer;
- wherein the drift zone, the first connection zone and the second connection zone are arranged in a semiconductor body, and
- wherein the first and the second connection zone are arranged distant to one another in a lateral direction of the semiconductor body,
- in which the channel control layer is arranged in a trench of the semiconductor body.

* * * * *